(12) United States Patent
Hatada et al.

(10) Patent No.: US 7,378,305 B2
(45) Date of Patent: May 27, 2008

(54) SEMICONDUCTOR INTEGRATED CIRCUIT AND FABRICATION PROCESS THEREOF

(75) Inventors: Akiyoshi Hatada, Kawasaki (JP);
Akira Katakami, Kawasaki (JP);
Naoyoshi Tamura, Kawasaki (JP);
Yosuke Shimamune, Kawasaki (JP);
Masashi Shima, Kawasaki (JP);
Hiroyuki Ohta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 11/132,325

(22) Filed: May 19, 2005

(65) Prior Publication Data

US 2006/0151776 A1 Jul. 13, 2006

(30) Foreign Application Priority Data

Jan. 11, 2005 (JP) ............................. 2005-004405

(51) Int. Cl.
*H01L 21/00* (2006.01)
*H01L 21/84* (2006.01)
(52) U.S. Cl. ...................... 438/153; 438/231; 438/752; 438/933
(58) Field of Classification Search .................. 257/19, 257/65, 192, 616, 900; 438/153, 154, 199, 438/230–232, 752, 933
See application file for complete search history.

(56) References Cited

U.S. PATENT DOCUMENTS 6,159,815 A 12/2000 Lustig et al.
(Continued)

FOREIGN PATENT DOCUMENTS

JP 8-167718 6/1996
(Continued)

OTHER PUBLICATIONS

Scott E. Thompson et al., "A 90-nm Logic Technology Featuring Strained-Silicon", IEEE Trans. Electron Devices, vol. 51, No. 11, pp. 1790-1797, Nov. 2004.
(Continued)

*Primary Examiner*—Thien F Tran
(74) *Attorney, Agent, or Firm*—Westerman, Hattori, Daniels & Adrian, LLP.

(57) ABSTRACT

A semiconductor integrated circuit device includes an n-channel MOS transistor formed on a first device region of a silicon substrate and a p-channel MOS transistor formed on a second device region of the silicon substrate, wherein the n-channel MOS transistor includes a first gate electrode carrying a pair of first sidewall insulation films formed on respective sidewall surfaces thereof, the p-channel MOS transistor includes a second gate electrode carrying a pair of second sidewall insulation films formed on respective sidewall surfaces thereof, first and second SiGe mixed crystal regions being formed in the second device region epitaxially so as to fill first and second trenches formed at respective, outer sides of the second sidewall insulation films so as to be included in source and drain diffusions of the p-channel MOS transistor, a distance between n-type source and drain diffusion region in the first device region being larger than a distance between the p-type source and drain diffusion regions in the second device region.

9 Claims, 19 Drawing Sheets

U.S. PATENT DOCUMENTS

| | | | |
|---|---|---|---|
| 6,165,826 A | * | 12/2000 | Chau et al. ............... 438/231 |
| 6,621,131 B2 | | 9/2003 | Murthy et al. |
| 2003/0025135 A1 | | 2/2003 | Matsumoto et al. |
| 2003/0045061 A1 | | 3/2003 | Kwon et al. |

FOREIGN PATENT DOCUMENTS

| JP | 2004-31753 | 1/2004 |
|---|---|---|
| WO | 00/01011 | 1/2000 |

OTHER PUBLICATIONS

Shih et al. "An Insulated Shallow Extention Structure for Bulk Mosfet" IEEE Transaction on Electron Devices, vol. 50, No. 11, Nov. 2003 (Nov. 2003), pp. 2294-2297, XP001175131.

Pfiester J R "Surface-Graded LDD Mosfet" Motorola Technical Developments, Motorola Inc. Schaumburg, Illinois, US, vol. 9, Aug. 1, 1989, pp. 1-2, XP000053758.

European Search Report dated Nov. 5, 2007 issued in corresponding European Application No. EP 05 01 1032.9.

* cited by examiner

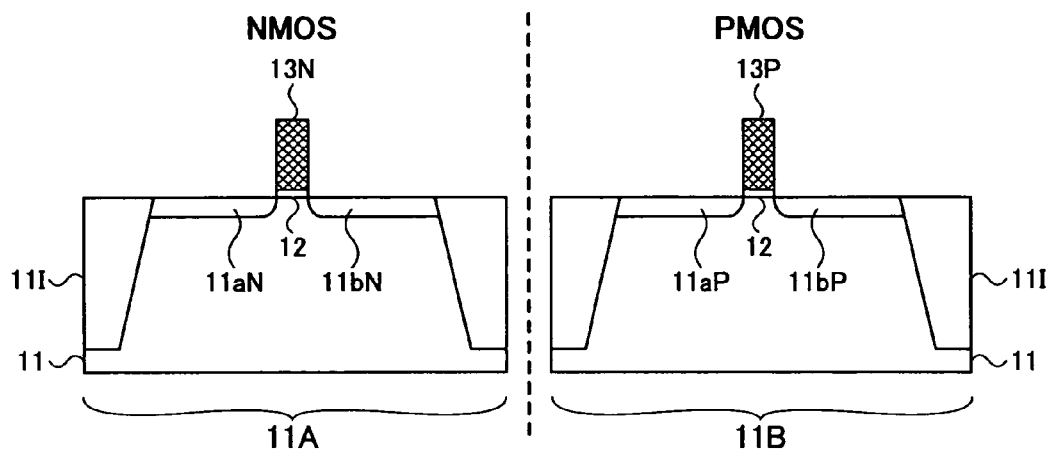
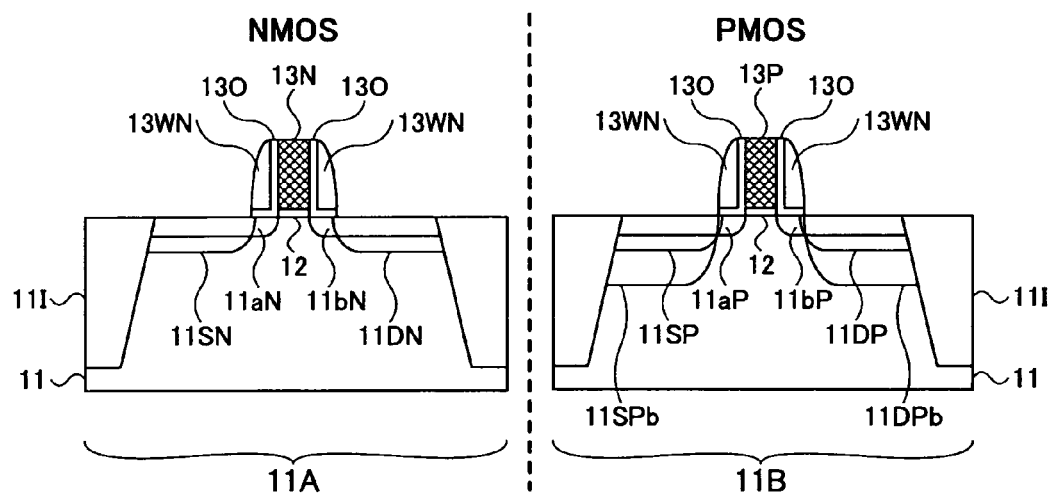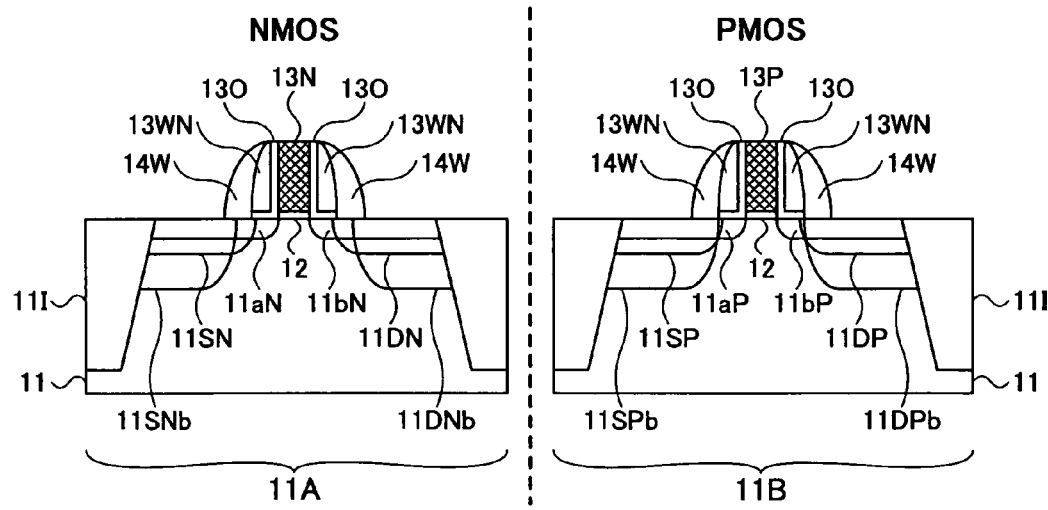

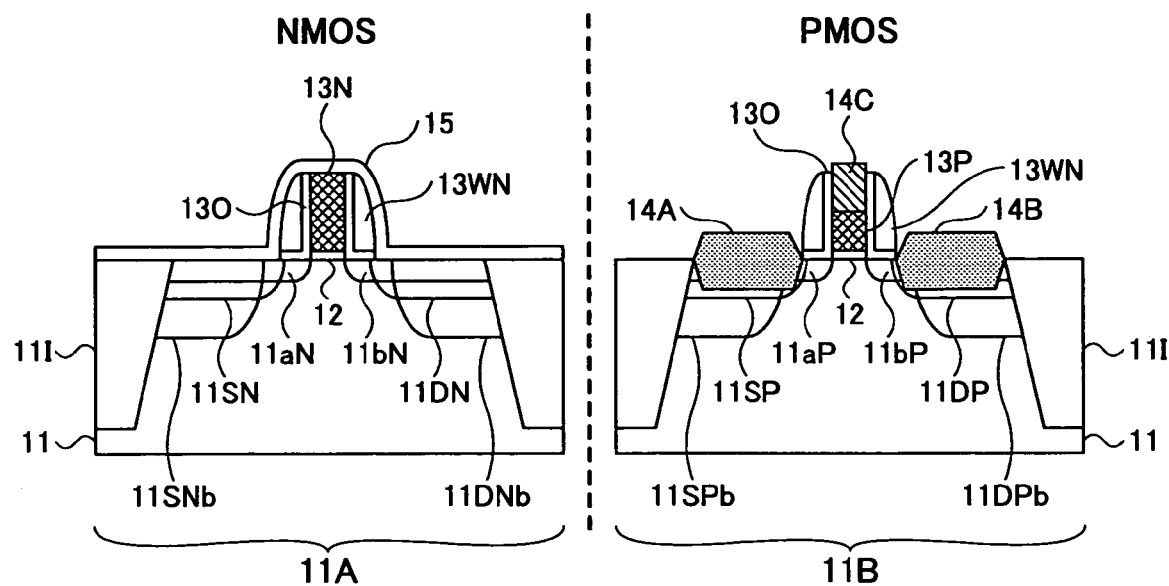
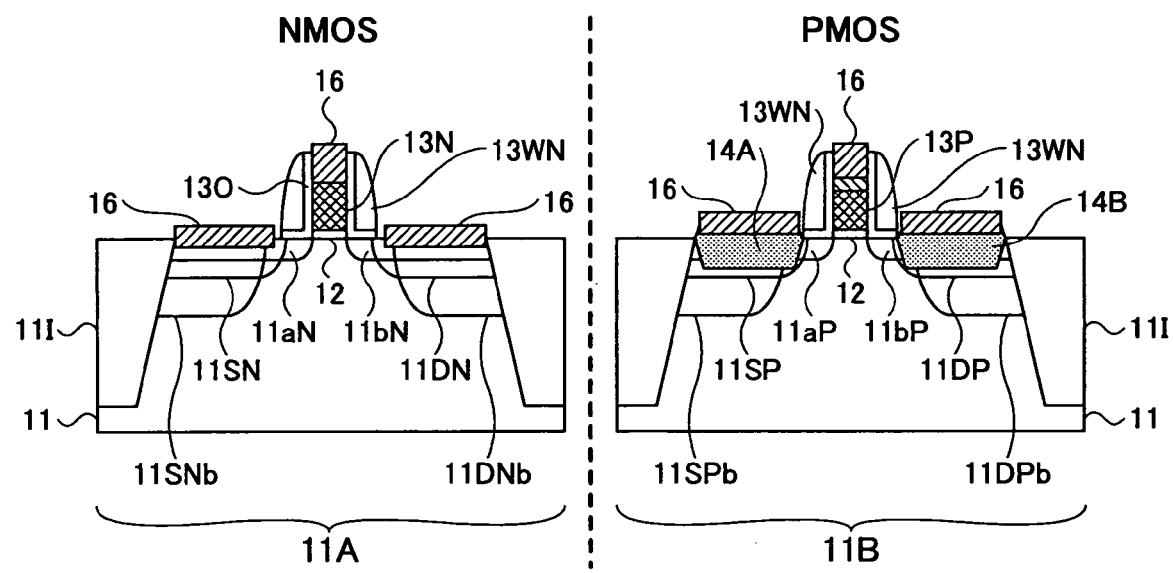

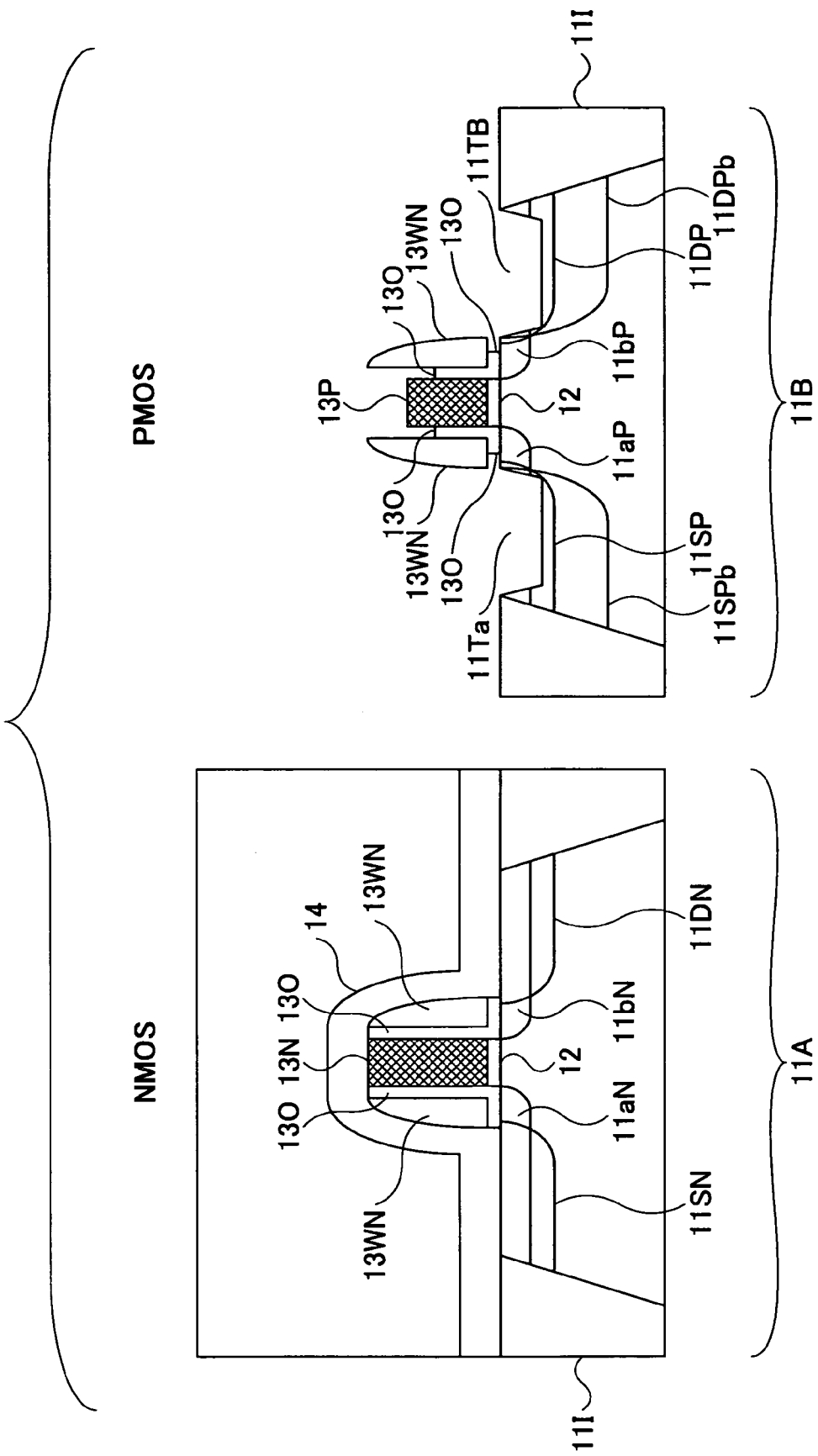

SEMICONDUCTOR INTEGRATED CIRCUIT AND FABRICATION PROCESS THEREOF

CROSS-REFERENCE TO RELATED APPLICATION

The present application is based on Japanese priority application No. 2005-004405 filed on Jan. 11, 2005, the entire contents of which are hereby incorporated by reference.

BACKGROUND OF THE INVENTION

The present invention generally relates to semiconductor device and more particularly to a semiconductor device and fabrication process thereof in which the operational speed there is improved by application of stress.

With the progress in the art of device miniaturization, ultrafine and ultra high-speed semiconductor devices having the gate length of 100 nm or less are becoming possible.

With such ultrafine and ultrahigh speed transistors, the area of the channel region right underneath the gate electrode is reduced significantly as compared with conventional semiconductor devices, and thus, the mobility of electrons or holes traveling through the channel region is influenced heavily by the stress applied to such a channel region. Thus, various attempts have been made for optimizing the stress applied to such a channel region, in the prospect of improving the operational speed of the semiconductor device further.

Generally, with semiconductor devices that use a silicon substrate for the channel, the mobility of holes is much smaller than the mobility of electrons, and thus, it is an important point for designing a semiconductor integrated circuit to improve the operational speed of the p-channel MOS transistor that uses holes as the carriers.

With such a p-channel MOS transistor, it is known that the mobility of the carriers is improved by applying a uniaxial compressive stress to the channel region, and thus, there is proposed a construction shown schematically in FIG. 1 as the means for applying the compressive stress to the channel region.

Referring to FIG. 1, a gate electrode 3 is formed on a silicon substrate 1 in correspondence to a channel region via a gate insulation film 2, and p-type diffusion regions 1a and 1b are formed in the silicon substrate 1 at both lateral sides of the gate electrode 3 so as to define the channel region therebetween. Further, sidewall insulation films 3A and 3B are formed on the side wall surface of the gate electrode 3 such that the sidewall insulation films 3A and 3B cover a part of the surface of the silicon substrate 1.

It should be noted that the diffusion regions 1a and 1b function respectively as the source and drain extension regions of the MOS transistor, and the flow of the holes transported through the channel region from the diffusion region 1a to the diffusion region 1b right underneath the gate electrode 3 is controlled by a gate voltage applied to the gate electrode 3.

In the construction of FIG. 1, SiGe mixed crystal layers 1A and 1B are formed in the silicon substrate 1 at respective outer sides of the sidewall insulation films 3A and 3B with epitaxial relationship to the silicon substrate 1, and source and drain regions of p-type are formed respectively in the SiGe mixed crystal layers 1A and 1B in continuation to the diffusion regions 1a and 1b.

In the MOS transistor of the construction of FIG. 1, it should be noted that the SiGe mixed crystal layers 1A and 1B have a larger lattice constant as compared with the lattice constant of the silicon substrate 1, and thus, there is formed a compressive stress in the SiGe mixed crystal layers 1A and 1B as shown by an arrow a. As a result, the SiGe mixed crystal layers 1A and 1B undergo straining in a direction generally perpendicular to the surface of the silicon substrate 1 as shown with an arrow b.

Because the SiGe mixed crystal layers 1A and 1B are formed in epitaxial relationship to the silicon substrate 1, such a strain in the SiGe mixed crystal layers 1A and 1B shown by the arrow b induces a corresponding strain in the channel region of the silicon substrate as represented with the arrow c, and as a result of such a strain, there is induced a uniaxial compressive stress in the channel region as shown in arrow d.

With the MOS transistor of FIG. 1, the symmetry of the Si crystal that constitutes the channel region is modulated locally as a result of such a uniaxial compressive stress applied to the channel region, while such a change of symmetry resolves the degeneration of valence band for the heavy holes and light holes, and there is caused increase of hole mobility in the channel region. With this, the operational speed of the transistor is improved. Such increase of hole mobility caused by the stress induced locally in a channel region and associated improvement of the transistor operational speed appear especially conspicuously in the ultrafine semiconductor devices having a gate length of 100 nm or less.

REFERENCES

Patent Reference 1 U.S. Pat. No. 6,621,131
Patent Reference 2 Japanese Laid-Open Patent Application 2004-31753
Patent Reference 3 Japanese Laid-Open Patent Application 8-167718
Non-Patent Reference 1 Thompson, S. E., et al., IEEE Transactions on Electron Devices, vol. 51, No. 11, November, 2004, pp. 1790-1797

SUMMARY OF THE INVENTION

Meanwhile, it is generally practiced, in semiconductor integrated circuits, that such a high speed p-channel MOS transistor is used to form a CMOS device together with an n-channel MOS transistor formed on a common substrate. However, various problems are encountered when attempt is made to form the p-channel MOS transistor with an n-channel MOS transistor simultaneously on the same substrate.

While the uniaxial compressive stress in the channel region explained previously with reference to FIG. 1 certainly contributes to the improvement of operational speed of the p-channel MOS transistors, the same uniaxial compressive stress applied to the channel region of the n-channel MOS transistor causes deterioration of operational speed in the n-channel MOS transistors. Thus, it is necessary to avoid occurrence of such a compressive stress in the device region of such an n-channel MOS transistor.

Further, it is preferable that the SiGe mixed crystal regions 1A and 1B are formed as closely as possible to the channel region right underneath the gate electrode 3 when to improve the operational speed of the p-channel MOS transistor in accordance with the principle of FIG. 1, while this means that it is preferable to form the sidewall insulation films of the gate electrode as thin as possible such that the trenches formed in the silicon substrate for formation of the SiGe mixed crystal layers 1A and 1B while using the sidewall insulation films as the self-aligned mask, are located as closely as possible.

On the other hand, when the thickness of the sidewall insulation film of the gate electrode is decreased in the n-channel MOS transistor in the same manner, the source region of n-type and the drain region of n-type are disposed too closely to each other in the device region, and there arises a problem that leakage current is caused to flow between the source and drain regions in the silicon substrate.

In view of the situations explained above, there is a need of the technology capable of forming the gate sidewall insulation films to have as small thickness as possible in the p-channel MOS transistor and as large thickness as possible in the n-channel MOS transistor, when to realize the high-speed CMOS device by combining the p-channel MOS transistor of improved operational speed by the effect of the stress induced by the SiGe mixed crystal regions according to the mechanism explained with reference to FIG. 1, with an n-channel MOS transistor, and that there is a need of such a technology capable of reducing the number of fabrication steps as much as possible.

In a first aspect, the present invention provides a semiconductor integrated circuit device, comprising:

a silicon substrate defined with a first device region and a second device region by a device isolation structure;

an n-channel MOS transistor formed on said first device region; and a p-channel MOS transistor formed on said second device region, said n-channel MOS transistor comprising a first gate electrode carrying a pair of first sidewall insulation films formed on respectively sidewall surfaces thereof, and source and drain diffusion regions of n-type formed in said first device region at respective outer sides of said first sidewall insulation films, said p-channel MOS transistor comprising: a second gate electrode carrying a pair of second sidewall insulation films formed on respectively sidewall surfaces thereof; source and drain diffusion regions of p-type formed in said second device region at respective outer sides of said second sidewall insulation films; and first and second SiGe mixed crystal regions formed in said second device region epitaxially with respect to said silicon substrate, said first and second SiGe mixed crystal regions being formed so as to fill first and second trenches formed at respective, outer sides of said second sidewall insulation films, said first and second trenches being formed so as to be included in said p-type source diffusion region and said p-type drain diffusion region, respectively, each of said first and second SiGe mixed crystal regions being formed in a self-aligned relationship with regard to a surface of said second sidewall insulation film corresponding thereto, a distance between said n-type source diffusion region and said n-type drain diffusion region in said first device region being larger than a distance between said p-type source diffusion region and said p-type drain diffusion region in said second device region when compared at a bottom edge of said respective diffusion regions.

In a second aspect, the present invention provides a semiconductor integrated circuit device, comprising:

a silicon substrate defined with a first device region and a second device region by a device isolation structure;

an n-channel MOS transistor formed on said first device region; and a p-channel MOS transistor formed on said second device region, said n-channel MOS transistor comprising a first gate electrode carrying a pair of first sidewall insulation films formed on respective sidewall surfaces thereof, and source and drain diffusion regions of n-type formed in said first device region at respective outer sides of said first sidewall insulation films, said p-channel MOS transistor comprising: a second gate electrode carrying a pair of second sidewall insulation films formed on respective sidewall surfaces thereof; source and drain diffusion regions of p-type formed in said second device region at respective outer sides of said second sidewall insulation films; and first and second SiGe mixed crystal regions formed in said second device region epitaxially with respect to said silicon substrate, said first and second SiGe mixed crystal regions being formed so as to fill first and second trenches formed at respective, outer sides of said second sidewall insulation films, said first and second trenches being formed so as to be included in said p-type source diffusion region and said p-type drain diffusion region, respectively, each of said first and second SiGe mixed crystal regions being formed in a self-aligned relationship with regard to a surface of said second sidewall insulation film corresponding thereto, wherein each of said first and second sidewall insulation films comprises: a lower sidewall insulation film of a material having resistance against HF; an intermediate sidewall insulation film of a material etched by HF and formed on said lower sidewall insulation film; and an upper sidewall insulation film of a material having resistance against HF and formed on said intermediate sidewall insulation film.

In another aspect, the present invention provides a method of fabricating a semiconductor integrated circuit device, said semiconductor integrated circuit device comprising a silicon substrate defined with a first device region and a second device region by a device isolation structure, an n-channel MOS transistor formed on said first device region and having a first gate electrode pattern, and a p-channel MOS transistor formed on said second device region and having a second gate electrode pattern, said p-channel MOS transistor including p-type SiGe mixed crystal regions formed epitaxially to said silicon substrate at both lateral sides of a channel region right underneath said second gate electrode pattern, said method comprising the steps of:

forming, in each of said first and second device regions, a first sidewall insulation film on respective sidewall surfaces of said first gate electrode pattern and said second gate electrode pattern by using a first material having resistance against HF;

forming a source region and a drain region of p-type in said silicon substrate at both lateral sides of said second gate electrode pattern by conducting an ion implantation process of a p-type impurity element in said second device region while using said second gate electrode pattern and said first sidewall insulation film on said second gate electrode pattern as a self-aligned mask;

forming, in said first device region, a second sidewall insulation film having an etching selectivity to said first sidewall insulation film, on said first sidewall insulation film formed on said first gate electrode pattern;

forming a source region and a drain region of n-type in said first device region at both lateral sides of said first gate electrode pattern, by conducting an ion implantation process of an n-type impurity element in said first device region while using said first gate electrode pattern, said first sidewall insulation film and said second sidewall insulation film on said first gate electrode pattern as a self-aligned mask;

forming a mask insulation film so as to cover said first device region and expose said second device region;

forming, after said step of forming said mask insulation film, first and second trenches at both lateral sides of said second gate electrode pattern with separation therefrom by said first sidewall insulation film, by etching said silicon substrate in said second device region while using said second gate electrode pattern and said first sidewall insulation film on said second gate electrode pattern as a mask; and forming, after said step of forming said first and second trenches, said p-type SiGe mixed crystal regions by causing an epitaxial growth of a p-type SiGe mixed crystal layer in said first and second trenches in a state in which said first device region is covered with said mask insulation film.

In a further aspect, the present invention provides a method of fabricating a semiconductor integrated circuit device, said semiconductor integrated circuit device comprising a silicon substrate defined with a first device region and a second device region by a device isolation structure, an n-channel MOS transistor formed on said first device region and having a first gate electrode pattern, and a p-channel MOS transistor formed on said second device region and having a second gate electrode pattern, said p-channel MOS transistor including p-type SiGe mixed crystal regions formed epitaxially to said silicon substrate at both lateral sides of a channel region right underneath said second gate electrode pattern, said method comprising the steps of:

forming a first sidewall insulation film on respective sidewall surfaces of said first gate electrode pattern and said second gate electrode pattern in said first and second device regions via a CVD oxide film, by using a first material having resistance against HF;

forming a second sidewall insulation film on said first sidewall insulation film covering said first gate electrode pattern and said second gate electrode pattern in said first and second device regions, by using a second material having etching selectivity to said first material;

forming a source region and a drain region of n-type at both lateral sides of said first gate electrode pattern by conducting an ion implantation process of an n-type impurity element into said silicon substrate in said first device region while using said first gate electrode pattern and said first and second sidewall insulation films on said first gate electrode pattern as a mask;

forming a source region and a drain region of p-type at both lateral sides of said second gate electrode pattern by conducting an ion implantation process of a p-type impurity element into said silicon substrate in said second device region while using said second gate electrode pattern and said first and second sidewall insulation films on said second gate electrode pattern as a mask;

forming a third sidewall insulation film on said respective sidewall surfaces of said first gate electrode pattern and said second gate electrode pattern in said first and second device regions, by using a third material having an etching selectivity to said first material;

forming first and second buffer diffusion regions of n-type respectively underneath said n-type source and drain regions with a mutual separation by conducting an ion implantation process of an n-type impurity element in said first device region while using said first gate electrode pattern and said first through third sidewall insulation films on said first gate electrode pattern as a mask;

forming first and second buffer diffusion regions of p-type respectively underneath said p-type source and drain regions with a mutual separation, by conducting an ion implantation process of a p-type impurity element in said second device region while using said second gate electrode pattern and said first through third sidewall insulation films on said second gate electrode pattern as a mask;

removing, in said first and second device regions, said second and third sidewall insulation films from said sidewall surfaces of said first and second gate electrodes by an etching process using HF;

forming a fourth sidewall insulation films having resistance to HF on each of said first and second gate electrodes in said first and second device regions;

forming first and second trenches at both lateral sides of said second gate electrode by etching said silicon substrate in said second device region while using said second gate electrode and said first and fourth sidewall insulation films on said second gate electrode as a mask; and filling said first and second trenches in said second device region by an epitaxial growth of a p-type SiGe mixed crystal layer.

In a further aspect, the present invention provides a method of fabricating a semiconductor integrated circuit device, said semiconductor integrated circuit device comprising a silicon substrate defined with a first device region and a second device region by a device isolation structure, an n-channel MOS transistor formed on said first device region and having a first gate electrode pattern, and a p-channel MOS transistor formed on said second device region and having a second gate electrode pattern, said p-channel MOS transistor including p-type SiGe mixed crystal regions formed epitaxially to said silicon substrate at both lateral sides of a channel region right underneath said second gate electrode pattern, said method comprising the steps of:

forming a first sidewall insulation film of a first material on respective sidewall surfaces of said first gate electrode pattern and said second gate electrode pattern in said first and second device regions;

forming a source region and a drain region of n-type at both lateral sides of said first gate electrode pattern by conducting an ion implantation process of an n-type impurity element into said silicon substrate in said first device region while using said first gate electrode pattern and said first sidewall insulation film on said first gate electrode pattern as a mask;

forming source and drain regions of p-type at both lateral sides of said second gate electrode pattern by conducting an ion implantation process of a p-type impurity element into said silicon substrate in said second device region while using said second gate electrode pattern and said first sidewall insulation film on said second gate electrode pattern as a mask;

forming a second sidewall insulation film on said fist sidewall insulation film in each of said first gate electrode pattern and said second gate electrode pattern in said first and second device regions;

forming first and second buffer diffusion regions of n-type respectively underneath said source and drain regions of n-type with a mutual separation and with a lower impurity concentration level, by conducting an ion implantation process of an n-type impurity element into said silicon substrate in said first device region while using said first gate electrode pattern and said first and second sidewall insulation film s on said first gate electrode pattern as a mask;

forming first and second buffer diffusion regions of p-type respectively underneath said source and drain regions of p-type with mutual separation and with a lower impurity concentration level, by conducting an ion implantation process of a p-type impurity element into said silicon substrate in said second device region while using said second gate electrode pattern and said first and second sidewall insulation films on said second gate electrode pattern as a mask;

removing said first and second sidewall insulation films in said first and second device regions from said sidewall surfaces of said first and second gate electrodes by etching;

forming a third sidewall insulation film having resistance to HF on each of said first and second gate electrodes in said first and second device regions;

forming first and second trenches at both lateral sides of said second gate electrode by etching said silicon substrate in said second device region while using said second gate electrode and said third sidewall insulation film on said second gate electrode as a mask; and filling said first and second trenches in said second device region by an epitaxial growth of a p-type SiGe mixed crystal layer.

According to the present invention, a large uniaxial stress is induced in the channel region of the p-channel MOS transistor by forming the p-type SiGe mixed crystal regions so as to fill the trenches at both lateral sides of the channel region and such that the p-type SiGe mixed crystal regions are located closely to the channel region. At the same time, the present invention secures a sufficient distance, in the n-channel MOS transistor formed on the same silicon substrate, between the deep source and drain diffusion regions formed in the silicon substrate. Thereby, it becomes possible to suppress the leakage current between the source region and the drain region of the n-channel MOS transistor effectively.

Here, it should be noted that a high quality crystal film is required for the SiGe mixed regions in such a p-channel MOS transistor that induces a uniaxial compressive stress in the channel region by filling the trenches with the SiGe mixed crystal. In order to form such a SiGe mixed crystal layer of high quality, it is not only sufficient to form the trenches by using a self-aligned process such that the trenches are formed as close to the channel region as possible, but it is also necessary to clean the surface of the trenches with an HF etchant, such that oxides or other impurities that may cause blockade of crystal growth of SiGe are removed.

It should be noted that the present invention solves the foregoing problem by using a material resistant to HF for the sidewall insulation film of the gate electrode of the p-channel MOS transistor and at the same time suppresses the leakage current by securing a large distance, in the silicon substrate, between the deep source and drain regions in the n-channel MOS transistor, by increasing the thickness of the sidewall insulation film of the gate electrode.

Further, the present invention can suppress the erosion of the CVD oxide film covering the surface of the first and second gate electrodes by HF, by forming each of the first and second sidewall insulation films in the form of lamination of: the lower sidewall insulation film resistant to HF; the intermediate sidewall insulation film formed on the lower sidewall insulation film and not resistant to HF; and the upper sidewall insulation film formed on the intermediate sidewall insulation film with resistance to HF. Thereby, the electrical properties of the semiconductor integrated circuit device is improved significantly.

Particularly, it is desirable with the present invention to interpose a film experiencing etching by HF, such as a CVD oxide film, between the gate electrode and the HF-resistant sidewall film and between the HF-resistance sidewall insulation film and the silicon substrate, for improvement of the interface characteristics. Thereby, the present invention avoids the problem of such a film not resistant to HF being etched by the cleaning processing conducted by HF at the time of forming the trenches, by forming the HF-resistant sidewall insulation film on the gate electrode via the film not resistant to HF, and then processing the structure thus obtained with an HF etchant to remove a part of the foregoing film not resistant to HF at the top surface of the gate electrode and at the sidewall surface of the sidewall insulation film. Thereby, a slit structure is formed in correspondence to such a part. Further, the present invention fills such a slit with a film resistant to HF. With the structure thus obtained, no such a slit is formed anymore even when an HF treatment is conducted later at the time of formation of the trenches.

Other objects and further features of the present invention will become apparent from the following detailed description when read in conjunction with the attached drawings.

BRIEF DESCRIPTION OF THE DRAWINGS

FIGS. 4A-4F are diagrams showing the fabrication process of a semiconductor integrated circuit device according to a second embodiment of the present invention;

FIGS. 7A-7H are diagrams showing the fabrication process of a semiconductor integrated circuit device according to a fifth embodiment of the present invention;

FIG. 8 is a diagram explaining the problem addressed in a sixth embodiment of the present invention;

DETAILED DESCRIPTION OF THE INVENTION

First Embodiment

FIGS. 2A-2F are diagrams showing the fabrication process of a semiconductor integrated circuit device according to a first embodiment of the present invention.

Figure 1:
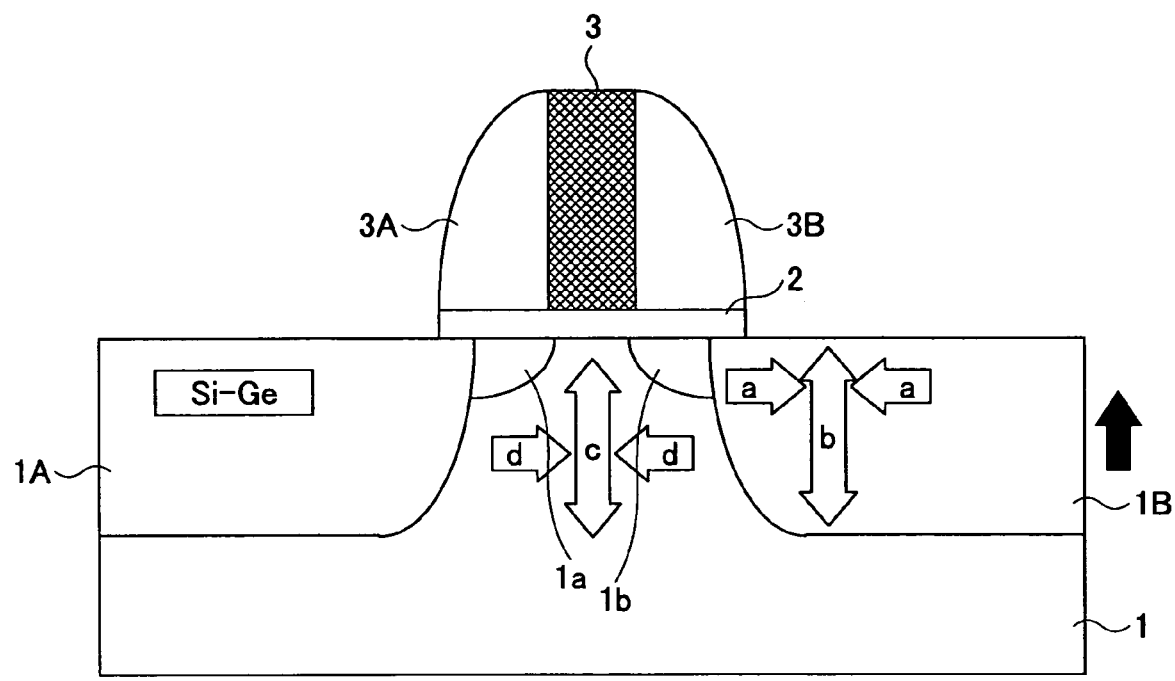
FIG. 1 is a diagram explaining the principle of a p-channel MOS transistor that uses SiGe compressive stressors for improvement of the device operational speed.
Figure 2A:
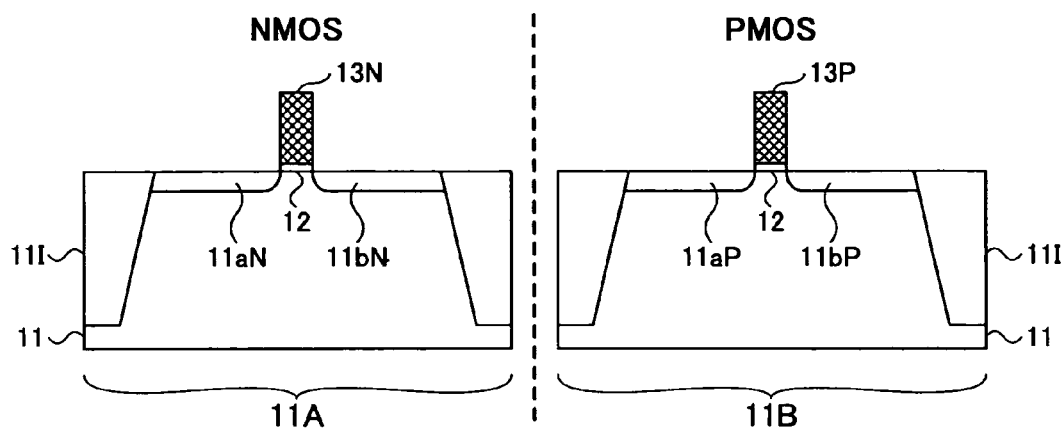
FIGS. 2A-2F are diagrams showing the fabrication process of a semiconductor integrated circuit device according to a first embodiment of the present invention.

Referring to FIG. 2A, a silicon substrate 11 is defined with a device region 11A for an n-channel MOS transistor and a device region 11B for a p-channel MOS transistor by an STI device isolation structure 11I, wherein the device region 11A is doped to p-type and forms a p-type well while the device region 11B is doped to n-type and forms an n-type well. Further, while not illustrated, there is conducted an ion implantation of a p-type impurity element in the device region 11A at a surface part of the silicon substrate 11 for the purpose of threshold control of the n-channel MOS transistor. Similarly, there is conducted an ion implantation of an n-type impurity element in the device region 11B at a surface part of the silicon substrate 11 for the purpose of threshold control of the p-channel MOS transistor.

On the device region 11A, there is formed a polysilicon gate electrode 13N via a gate insulation film 12 of thermal oxide film or SiON film, or alternatively a high-K dielectric. Similarly, a polysilicon gate electrode 13P is formed on the device region 11B via the same gate insulation film 12, wherein it should be noted that source and drain extension regions 11$a$N and 11$b$N of n-type are formed in the silicon substrate 11 in correspondence to the device region 11A at both lateral sides of the polysilicon gate electrode 13N and source and drain extension regions 11$a$P and 11$b$P of p-type are formed in the silicon substrate 11 in correspondence to the device region 11B at both lateral sides of the polysilicon gate electrode 13P, by introducing an n-type impurity element and a p-type impurity element separately into the device regions 11A and 11B by an ion implantation process while using the gate electrode 13N or 13P as a self-aligned mask. In the case of introducing an n-type impurity element, As+ may be introduced under an acceleration voltage of 1 keV with a dose of $2\times10^{15}$ cm$^{-2}$. In the case of introducing a p-type impurity element, B+ may be introduced under an acceleration voltage of 0.3 keV with a dose of $1\times10^{15}$ cm$^{-2}$.

Here, it should be noted that the SiON film used for the gate insulation film may be formed by plasma nitridation of a thermal oxide film or by a direct plasma CVD process. Further, in the case a high-K dielectric film is used for the gate insulation film, it is possible to use a metal oxide such as $HfO_2$, $ZrO_2$ or $Al_2O_3$ or a metal silicate such as $HfSiO_4$ or $ZrSiO_4$, wherein these high-K dielectric films may be formed by an MOCVD process or atomic layer CVD process (so-called ALD process).

Figure 2B:
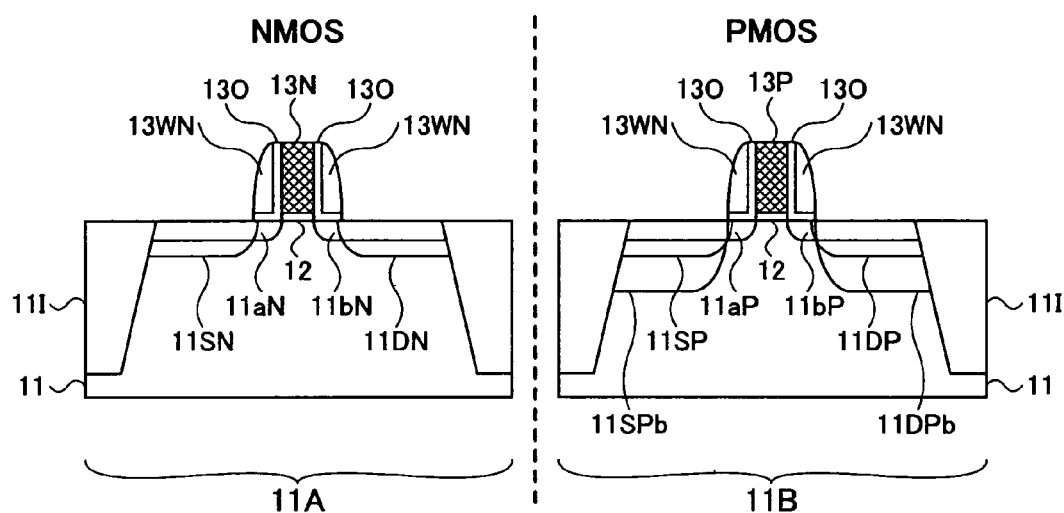

Next, in the step of FIG. 2B, a CVD oxide film 13O is formed on the surface of the silicon substrate 11 so as to cover the polysilicon gate electrodes 13N and 13P with a thickness of about 10 nm such that the CVD oxide film 13 covers the exposed surface of the silicon substrate 11 and the surface of the polysilicon gate electrodes 13N and 13P continuously. Following this, formation of a sidewall insulation film 13WN on the sidewall surface of the polysilicon gate electrodes 13N and 13P is made via the CVD oxide film 13O, such that the sidewall insulation films 13WN have resistance against dry and wet etching of silicon and further against HF processing, by using a material such as SiON or SiN with the thickness of 30 nm, for example.

It should be noted that such a sidewall insulation film 13WM can be formed by depositing an SiON film or an SiN film on the structure of FIG. 2A by a low temperature process of 600° C. or lower such that there is caused no disturbance in the impurity concentration profile in the foregoing source and drain extension regions, followed by an etch back process conducted until the surface of the silicon substrate 11 is exposed.

Further, in the step of FIG. 2B, the device region 11B is covered with a resist film not illustrated, and an n-type impurity element such as As+ is introduced under the acceleration voltage of 10 keV with a dose of $3\times10^{15}$ cm$^{-2}$ while using the gate electrode 13N, the sidewall oxide films 13O, and the sidewall insulation films 13WN as a mask.

With this, deep n-type diffusion regions are formed at the respective outer sides of the sidewall insulation films 13WN as the source and drain regions 11SN and 11DN of the n-channel MOS transistor.

Further, in the step of FIG. 2B, the device region 11A is covered with a resist film not illustrated, and a p-type impurity element such as B+ is introduced under the acceleration voltage of 3 keV with a dose of $1\times10^{15}$ cm$^{-2}$ while using the gate electrode 13P, the sidewall oxide films 13O and the sidewall insulation films 13WN as a mask. With this, deep p-type diffusion regions are formed at the respective outer sides of the sidewall insulation films 13WN as the source and drain regions 11SP and 11DP of the p-channel MOS transistor.

Further, in the step of FIG. 2B, buffer source and drain regions 11SPb and 11DPb of p$^-$-type are formed respectively underneath the p-type source and drain regions 11SP and 11DP for the purpose of improving the breakdown voltage of the source and drain regions 11SP and 11DP, by conducting an ion implantation process of a p-type impurity element such as B+ into the device region 11B with a larger acceleration voltage of 10 keV and smaller dose of $1\times10^{13}$ cm$^{-2}$, while using the polysilicon gate electrode 13P, the sidewall oxide films 13O, and the sidewall insulation films 13WN as a mask.

Figure 2C:
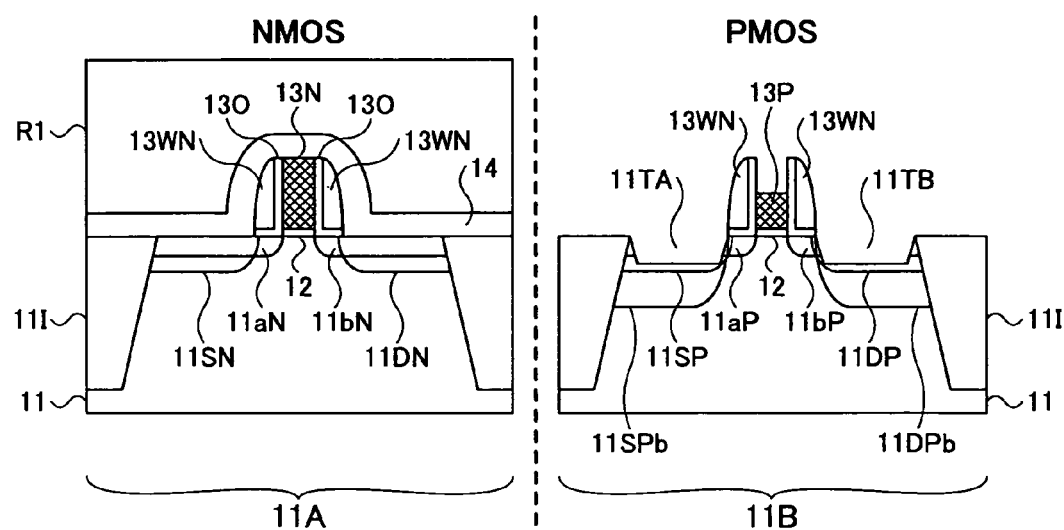

Next, in the step of FIG. 2C, a silicon oxide film 14 is formed on the structure of FIG. 2B by a CVD process with a thickness of 50 nm, followed by removal of the silicon oxide film 14 from the device region 11B in the state that the device region 11A is covered by a resist mask R1.

Further, in the step of FIG. 2C, a dry etching process or a wet etching process that uses an organic alkaline etchant is applied to the silicon substrate 11 in the device region 11B in the state that the device region 11A is covered with the resist mask R1 while using the polysilicon gate electrode 13P and the sidewall insulation films 13WN as a self-aligned mask. Here, it is possible to use the dry etching process and wet etching process may be conducted in appropriate combination.

Further, in the step of FIG. 2C, trenches 11TA and 11TB are formed at respective outer sides of the sidewall insulation films 13WN with a depth not exceeding the depth of the source and drain regions 11SP and 11DP, such as the depth of 40 nm. Here, it should be noted that this step of forming the trenches 11TA and 11TB can be conducted after removal of the resist mask R1.

After formation of the trenches 11TA and 11TB, the structure thus obtained is subjected to a wet etching process by using HF, and the impurities such as etching residue are removed from the bottom surface and sidewall surface of the trenches 11TA and 11TB.

Further, in the step of FIG. 2C, it should be noted that the polysilicon gate electrode 13P undergoes partial etching with the formation of the trenches 11TA and 11TB in the silicon substrate 11.

Figure 2D:
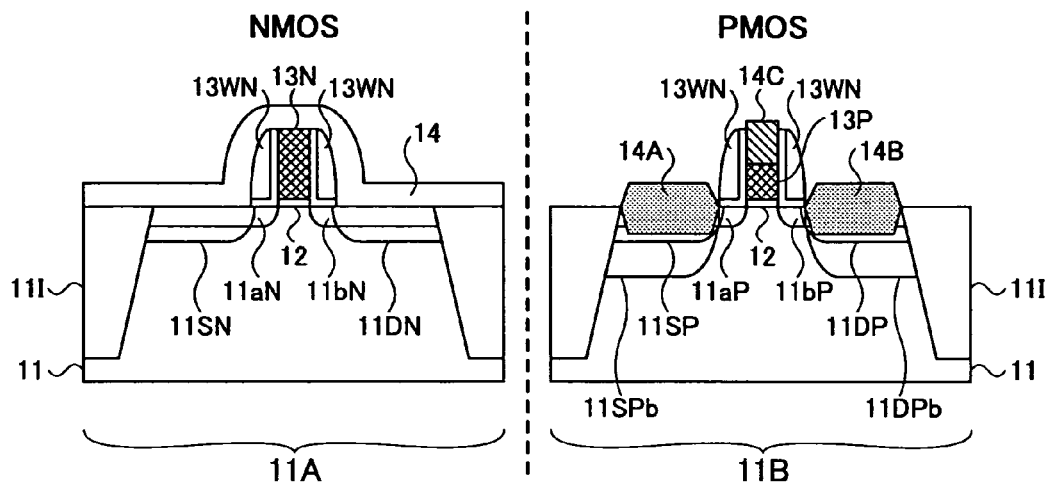

Next, in the step of FIG. 2D, the resist film R1 is removed, and the structure thus obtained is introduced into a low-pressure CVD apparatus. Thereby, source gases of silane (SiH$_4$) and germane (GeH$_4$) are introduced together with a p-type dopant gas such as diborane at the substrate temperature of 600° C. or less, and p-type SiGe mixed crystal layers 14A and 14B are grown epitaxially so as to fill the trenches 11TA and 11TB.

For example, the growth of such SiGe mixed crystal layers 14A and 14B can be conducted at the substrate temperature of 550° C. in hydrogen ambient of 5-1330 Pa by supplying the SiH$_4$ source gas, the GeH$_4$ source gas, the $B_2H_6$ dopant gas, and further a hydrogen chloride (HCl) etching gas, such that there is realized a partial pressure of 1-10 Pa for the $SiH_4$ source gas, a partial pressure of 0.1-10 Pa for the $GeH_4$ source gas, a partial pressure of $1\times10^{-5}-1\times10^{-3}$ Pa for the $B_2H_6$ dopant gas, and a partial pressure of 1-10 Pa for the HCl etching gas.

With the epitaxial growth of the p-type SiGe mixed crystal layers 14A and 14B, there is caused a growth of a p-type polycrystalline SiGe layer on the polysilicon gate electrode 13P. Thereby, it should be noted that the growth of the SiGe layers 14A-14C is conducted for 1-40 minutes, and as a result, the SiGe mixed crystal layers 14A and 14B filling the respective trenches 11TA and 11TB are grown beyond the level of the interface between the silicon substrate 11 and the gate insulation film 12.

As a result of the formation of the SiGe mixed crystal layers 14A and 14B, a large uniaxial compressive stress is applied to the channel region right underneath the gate insulation film 12, and there is caused a significant increase of mobility for the holes transported through the channel region.

Further, because the low temperature growth is made over a limited area with the present invention, it is confirmed that the SiGe layers 14A and 14B thus grown can contain Ge with an atomic concentration level of 28%, without deteriorating the crystal quality, wherein it should be noted that this concentration of 28% exceeds the atomic concentration of 20%, which has been recognized as the limiting concentration of Ge that a SiGe layer can contain when to cause epitaxial growth of such a SiGe layer on a silicon substrate.

With the structure of FIG. 2D, it should be noted that the trenches 11TA and 11TB are formed in the step of FIG. 2C while using the sidewall insulation film 13WN as a self-aligned mask. Thus, the SiGe mixed crystal layers 14A and 14B thus formed are located closest to the channel region, and it becomes possible to maximize the uniaxial compressive stress applied to the channel region.

Figure 2E:
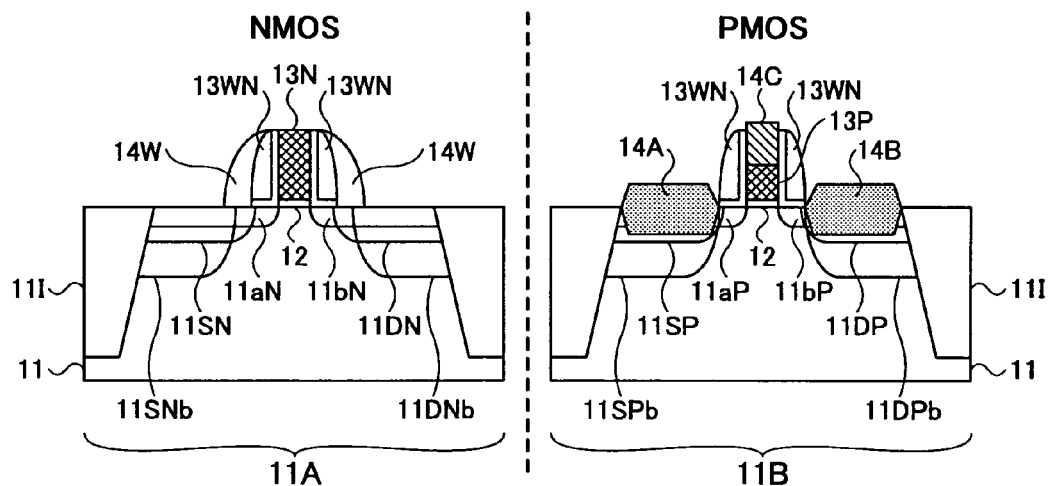
Figure 2F:
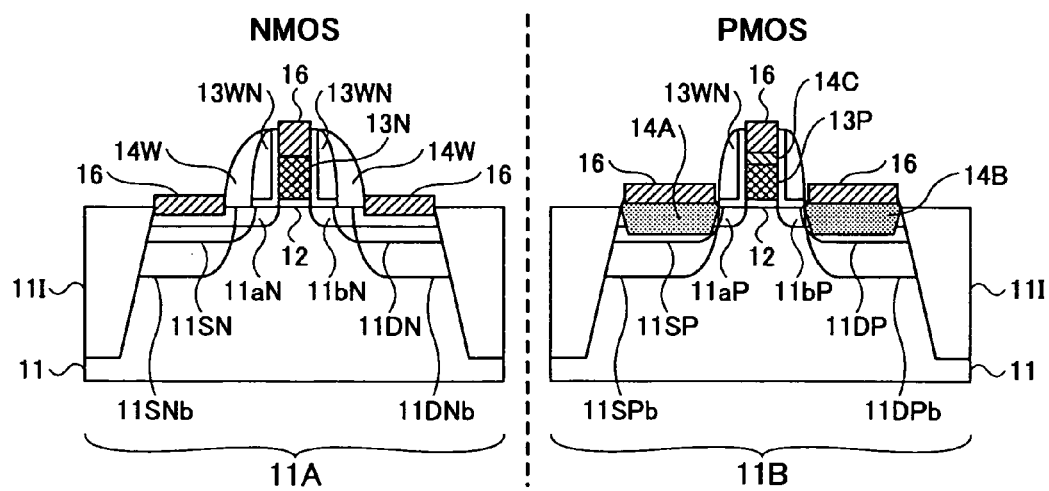

Further, in the step of FIG. 2E, the CVD oxide film 14 remaining in the device region 11A is etched back until the surface of the silicon substrate 11 is exposed, and as a result, there are formed outer sidewall oxide films 14W in the device region 11A at further outer sides of the SiN sidewall insulation films 13WN on the gate electrode 13N, and buffer source and drain regions 11SNb and 11DNb of $n^-$-type are formed in the silicon substrate at a deeper level of the source and drain regions 11SN and 11DN by conducting an ion implantation process of an n-type impurity element such as P+ into the device region 11B under the acceleration voltage of 15 keV with a dose of $7\times10^{13}$ cm$^{-2}$ in the state the device region 11B is covered by a resist mask not illustrated while using the polysilicon gate electrode 13N, the sidewall oxide films 13O, the sidewall insulation films 13WN and the outer sidewall oxide films 14W as a mask.

By forming such buffer source and drain regions 11SNb and 11DNb at further outer sides of the outer sidewall oxide films 14W, it becomes possible with the present embodiment to secure a sufficient distance between the diffusion regions 11SNb and 11DNb, and occurrence of leakage current via such diffusion regions is effectively suppressed.

After the step of FIG. 2E, a salicide process is conducted, and a silicide layer 16 of nickel silicide, cobalt silicide, or the like, is formed on the n-type source and drain regions 11SN and 11DN, p-type source and drain regions 11SP and 11DP, the n-type polysilicon gate electrode 13N and the p-type polysilicon gate electrode 13P.

Thus, according to the present invention, it becomes possible to construct a high speed CMOS device by forming an n-channel MOS transistor and a p-channel MOS transistor on a common substrate.

Particularly, it is possible with the present invention to expose a crystal surface such as Si(111) surface at the sidewall surface of the trenches 11TA and 11TB, by using a wet etching process in the trench formation step of FIG. 2C, and it becomes possible with the process of FIG. 2D to improve the quality of the SiGe mixed crystal layers 14A and 14B thus grown epitaxially.

Figure 3:
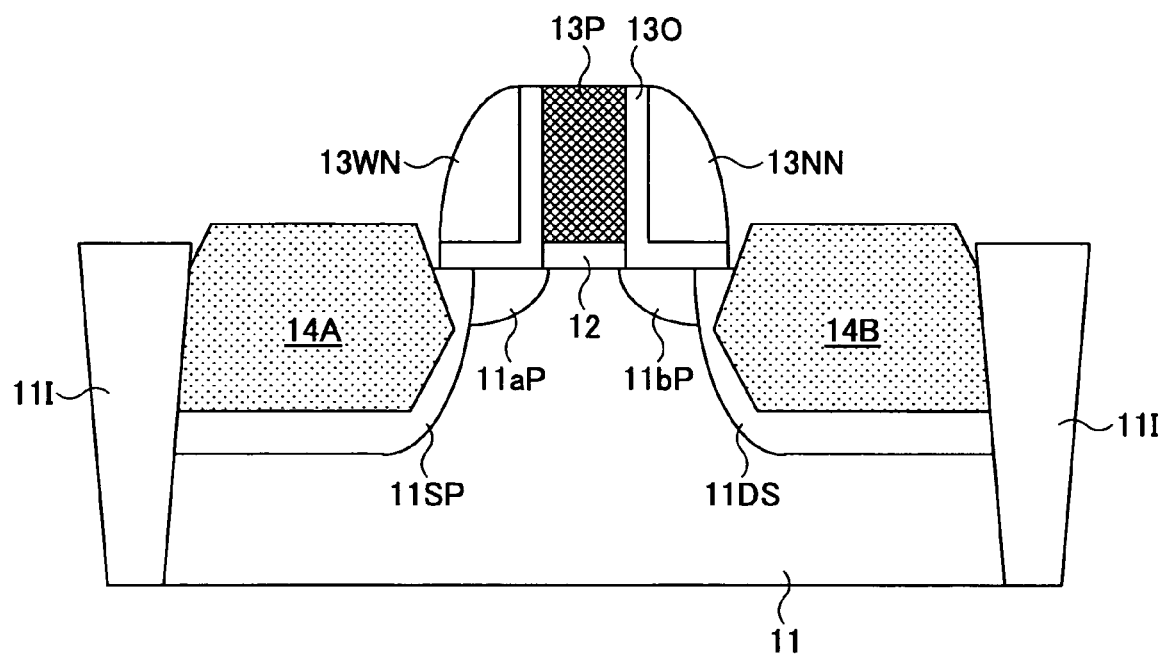
FIG. 3 is a diagram showing the construction of a p-channel MOS transistor constituting a semiconductor integrated circuit device according to an embodiment of the present invention.

Further, by combining a dry etching process and a wet etching in the foregoing step of forming the trenches, it becomes possible to form the sidewall surfaces of the trenches 11TA and 11TB to have the shape of a wedge invading toward the channel region right underneath the gate insulation film 12, as shown in FIG. 3. In this case, the tip end part of the SiGe mixed crystal layers 14A and 14B filling the trenches 11TA and 11TB invade into the regions right underneath the respective sidewall insulation films 13WN and thus comes very close to the channel region. Thereby, the magnitude of the uniaxial compressive stress in the channel region is increased further and the operational speed of the p-channel MOS transistor is increased further.

Furthermore, by forming diffusion region 11SPb and 11DPb of $p^-$-type respectively underneath the p-type source and drain regions 11SP and 11DP in the device region 11B in the process of FIG. 2B of the present embodiment, it becomes possible to avoid sharp change of impurity concentration at the p/n junction right underneath the p-type source and drain regions 11SP and 11DP even in the case the SiGe mixed crystal layers 14A and 14B are formed with high dopant concentration by supplying a dopant gas during the epitaxial growth process, and the problem such as increase of the junction capacitance or degradation of the breakdown voltage is successfully avoided.

Second Embodiment

Next, fabrication process according to a second embodiment of the present invention will be described with reference to FIGS. 4A-4F, wherein those parts corresponding to the parts described previously are designated by the same reference numerals and the description thereof will be omitted.

Figure 4D:
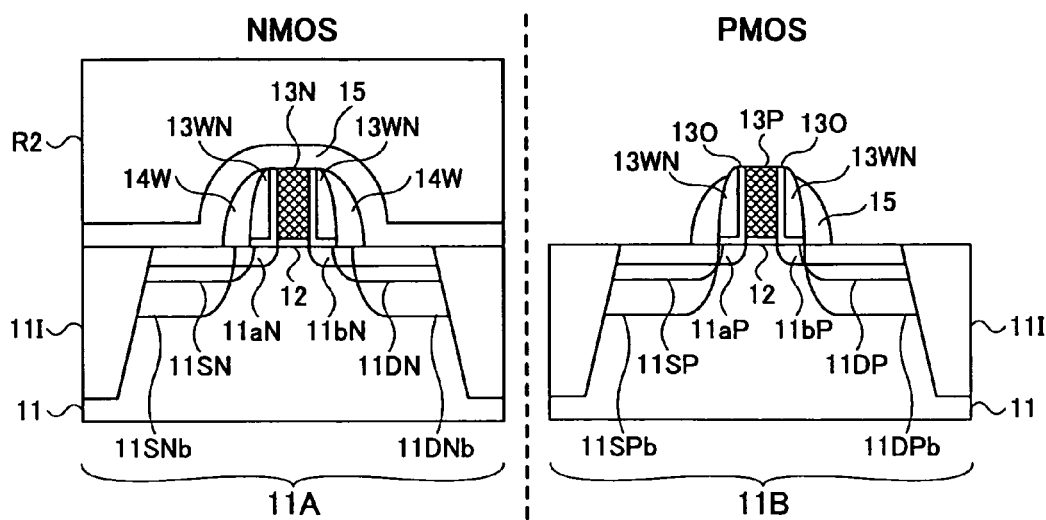

Referring to FIGS. 4A-4F, the process of FIGS. 4A and 4B are identical with the process of FIGS. 2A and 2B, and thus, the description thereof will be omitted.

In the present embodiment, the outside sidewall oxide films 14W are formed at the outer sides of the sidewall insulation films 13WN with the thickness of about 40 nm in the process of FIG. 4C by the deposition and etch back of the CVD oxide film in both of the device regions 11A and 11B, and in this state, the foregoing $n^-$-type buffer source and drain diffusion regions 11SNb and 11DNb are formed by conducting an ion implantation process of an n-type impurity element into the silicon substrate 11 in the device region 11A while using the gate electrode 12N, the sidewall oxide films 13O and the sidewall insulation films 13WN as a mask. Here, it should be noted that the foregoing deposition of the CVD oxide film is preferably conducted by a plasma CVD process at the temperature of 600° C. or lower.

Further, in the step of FIG. 4D, a CVD oxide film 15 is formed on the structure of FIG. 4C with the thickness of about 50 nm, and a resist pattern R2 that covers device region 11A is formed similarly to FIG. 2C. Furthermore, while using the resist pattern R2 as a mask, the CVD oxide film 15 is removed in the device region 11B by an etching processing, which may be any of anisotropic dry etching, wet etching in HF, or a suitable combination of these.

Figure 4E:
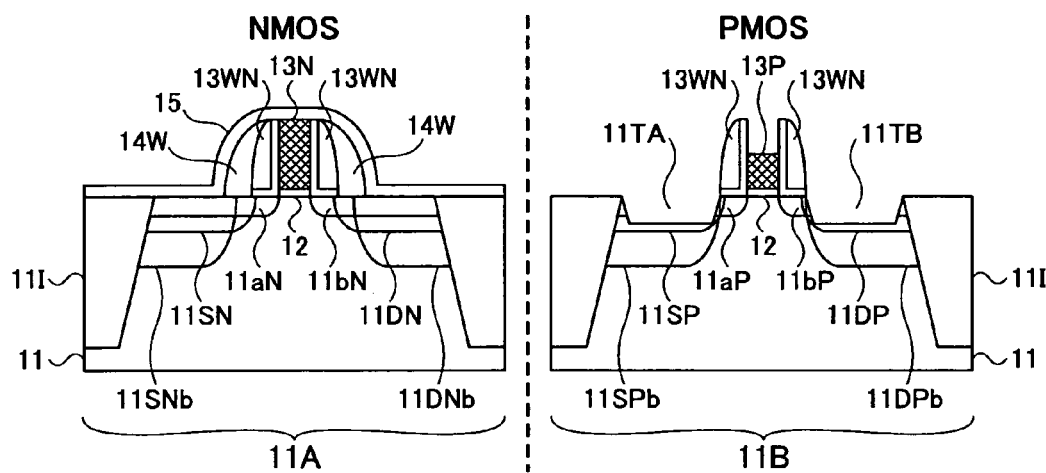

Further, in the step of FIG. 4E, the silicon substrate 11 is etched in the device region 11B similarly to the case of FIG. 2C while using the sidewall insulation films 13WN, the sidewall oxide films 13O and the polysilicon gate electrode pattern 13P as a self-aligned mask, to form trenches 11TA and 11TB. In the step of FIG. 4E, it can be seen that, with formation of the trenches 11TA and 11TB, the top part of the polysilicon gate electrode 13P is also removed as a result of the etching. Here, it should be noted that the deposition of the CVD oxide film 15 is preferably conducted by a plasma CVD process at the temperature of 600° C. or less.

Figure 4F:
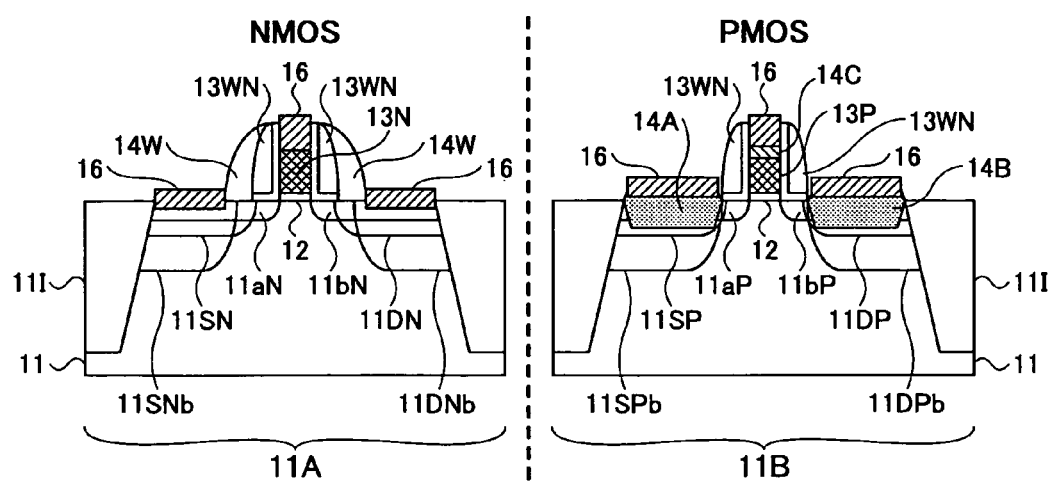

Further, in the step of FIG. 4F, the SiGe mixed crystal layers 14A and 14B are grown epitaxially so as to fill the trenches 11TA and 11TB thus formed, similarly to the step of FIG. 2D explained previously. Thereby, it should be noted that there occurs no growth of SiGe mixed crystal layers on the device region 11A covered with the CVD oxide film 15. Further, it should be noted that there occurs a growth of polycrystalline SiGe layer 14C on the polysilicon gate electrode 13P simultaneously to the growth of the SiGe mixed crystal layers 14A and 14B.

Further, in the step of FIG. 4F, the CVD oxide film 15 is removed by a wet etching process, and a silicide layer 16 is formed on the exposed n-type source and drain regions 11SN and 11DN, the p-type source and drain regions 11SP and 11DP, the n-type polysilicon gate electrode 13N and further on the p-type polysilicon gate electrode 13P.

According to the present embodiment, it should be noted that formation of the SiGe mixed crystal regions 14A and 14B is conducted immediately before the formation of the silicide. Further, there is no process of forming a sidewall insulation film after the formation of the SiGe mixed crystal regions 14A and 14B, contrary to the step of FIG. 2E. Thus, the SiGe mixed crystal layers 14A and 14B are not exposed to the charged particles formed in the dry etching process at the time of formation of such sidewall insulation films. Thus, there is no danger that Ge atoms, released from the SiGe mixed crystal layers 14A and 14B as a result of collision of these charged particles, cause contamination in the production line of the semiconductor device, and production of other semiconductor devices such as the one not using the SiGe mixed crystal, is not disturbed. Further, because the surface of the SiGe mixed crystal layers 14A and 14B are not exposed to the charged particles used with the dry etching process, the problem encountered in the silicide formation step of FIG. 4F that the surface of the SiGe mixed crystal layers 14A and 14B becomes irregular and formation of silicide becomes difficult, is successfully avoided.

Third Embodiment

Next, the fabrication process of the semiconductor integrated circuit according to a third embodiment of the present invention will be explained with reference to FIG. 5A-5F, wherein those parts corresponds to the parts explained previously are designated by the same reference numerals and the explanation thereof will be omitted.

Figure 5A:
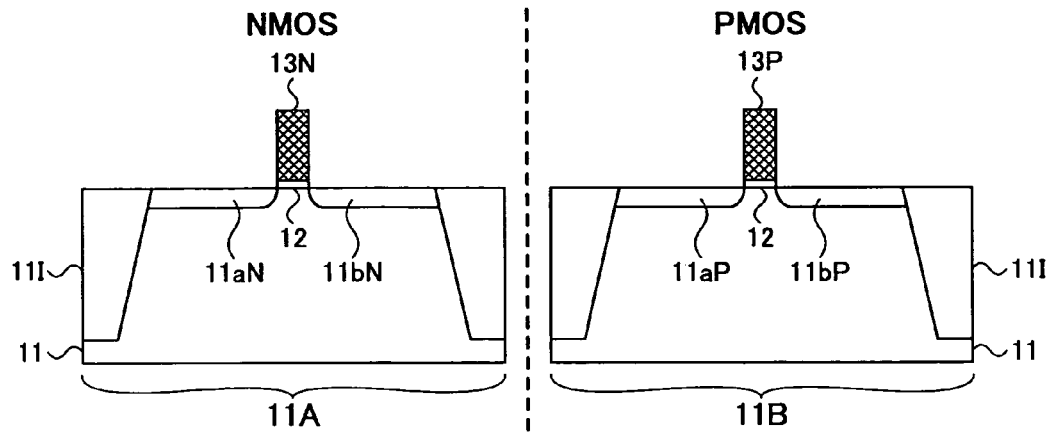
FIGS. 5A-5F are diagrams showing the fabrication process of a semiconductor integrated circuit device according to a third embodiment of the present invention.

Referring to FIG. 5A-5F, the process of FIG. 5A is identical to the process of FIG. 2A or FIG. 4A explained previously and the explanation thereof will be omitted.

Figure 5B:
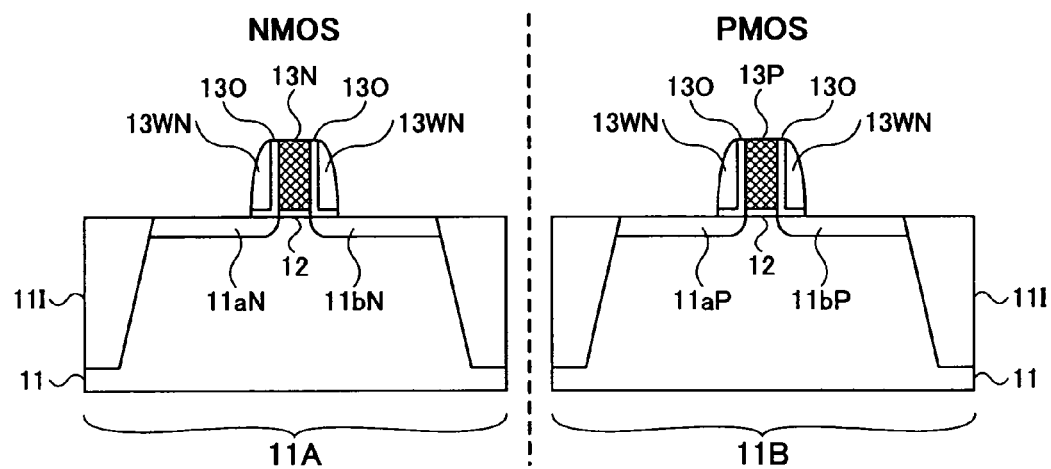
Figure 5C:
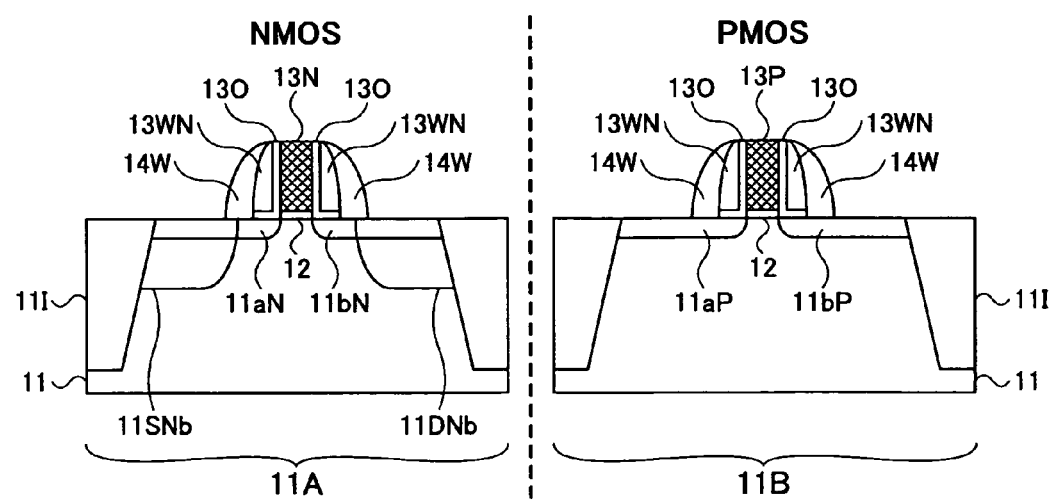

In the process of FIG. 5B, the SiN sidewall insulation films 13WN are formed on the respective sidewall surfaces of the polysilicon gate electrodes 13N and 13P similarly to the process of FIG. 4B, except that no further ion implantation process is conducted in the step of FIG. 5B in the present embodiment and the process proceeds to the step of FIG. 5C.

In the step of FIG. 5C, the outer sidewall oxide films 14W are formed at respective outer sides of the SiN or SiON sidewall insulation films 13WN covering each of the polysilicon gate electrodes 13N and 13P in the device regions 11A and 11B, similarly to the process of FIG. 2E, the device region 11B is covered with a resist mask not illustrated.

Further, ion implantation of an n-type impurity element such as P+ or As+ is conducted into the device region 11A while using the polysilicon gate electrode 13N, the CVD oxide films 13O, the sidewall insulation films 13WN and the outer sidewall oxide films 14W as a mask, and with this, buffer source and drain diffusions of n⁻-type similar to the buffer source and drain diffusion regions 11SNb and 11DNb are formed in the silicon substrate 11 at the outer sides of the outer sidewall insulation films 14W.

Figure 5D:
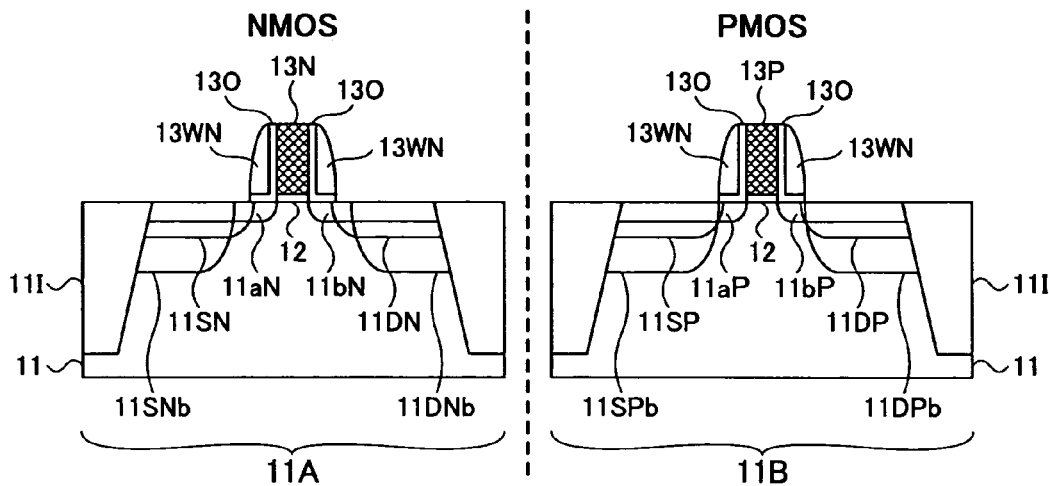

Further, in the step of FIG. 5D, the outer sidewall oxide films 14W are removed at the device regions 11A and 11B, and the source and drain regions 11SN and 11DN of n-type are formed at a deeper level of the source and drain extension regions 11aN and 11bN but shallower than the buffer source and drain regions 11SNb and 11DNb, by covering the device region 11B by a resist mask (not shown) and by introducing an n-type impurity element such as P+ or As+ into the device region 11A by an ion implantation process while using the polysilicon gate electrode 13N, the sidewall oxide films 13O and the sidewall insulation films 13WN as a self-aligned mask.

Further, in the step of FIG. 5D, the device region 11A is covered by a resist mask (not shown) and B+ is introduced into the device region 11B by an ion implantation process under the acceleration voltage of 3 keV and the dose of $1 \times 10^{15}$ cm⁻², and with this, p-type source and drain regions 11SP and 11DP are formed in the silicon substrate 11 at the level deeper than the source and drain extension regions 11aP and 11bP.

Further, in the step of FIG. 5D, ion implantation of B+ is subsequently conducted into the device region 11B under the acceleration voltage of 10 keV with the dose of $1 \times 10^{13}$ cm⁻², and the buffer source and drain regions 11SPb and 11DPb of p⁻-type are formed at the level deeper than the foregoing source and drain regions 11SP and 11DP of p-type.

Figure 5E:
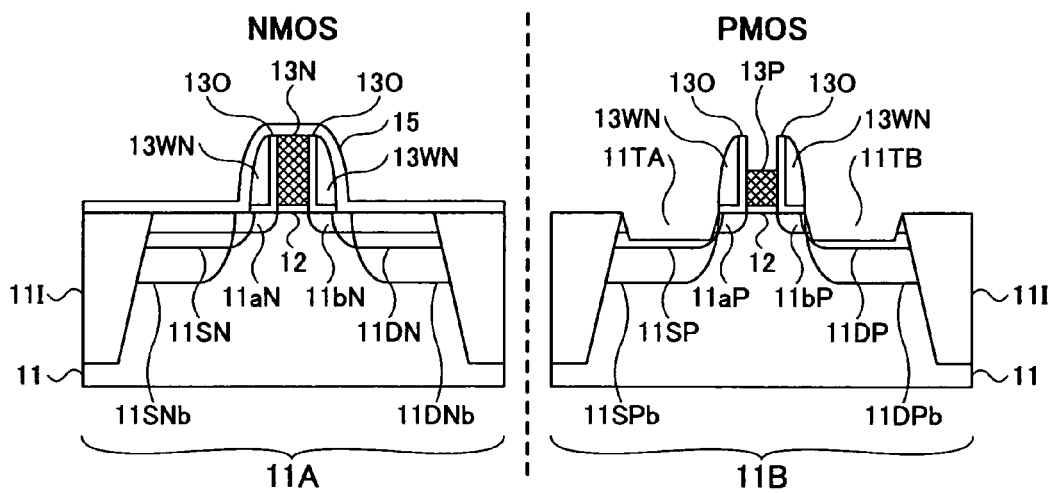

Further, in the step of FIG. 5E, the device region 11A is covered by an oxide film similar to the CVD oxide film 15 used with the step of FIG. 4E explained before, and the trenches 11TA and 11TB are formed in the device region 11B at both lateral sides of the gate electrode 13P similarly to the step of FIG. 2C or FIG. 4E while using the polysilicon gate electrode 13P, the sidewall oxide films 13O and the sidewall insulation films 13WN as a mask. With the formation of the trenches, it should be noted that the top part of the p-type polysilicon gate electrode pattern 13P also experiences etching.

Figure 5F:
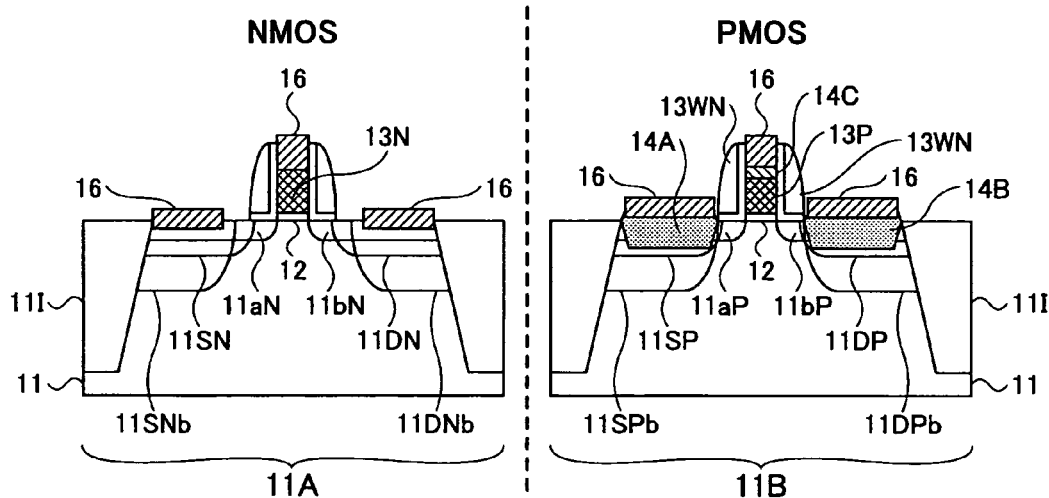

Further, in the step of FIG. 5F, the SiGe mixed crystal layers 14A and 14B re grown epitaxially respectively in the trenches 11TA and 11TB similarly to the step of FIG. 2D or FIG. 4F, and as a result, a large uniaxial compressive stress is induced in the channel region right underneath the gate electrode 13P. Further, there occurs a growth of the p-type polycrystalline SiGe layer 14C on the p-type polysilicon gate electrode 13P at the same time.

In the step of FIG. 5F, there are further formed the silicide layers 16 on the exposed surface of the SiGe mixed crystal layers 14A and 14B and on the polysilicon SiGe layer 14C and further on the n-type source and drain regions 11SN and 11DN and on the n-type polysilicon gate electrode 13N.

With the process of FIGS. 5A-5F, too, it is possible to form the SiGe mixed crystal layers 14A and 14B very close to the channel region formed right underneath the polysilicon gate electrode 13P.

Fourth Embodiment

Next, a method of fabricating a semiconductor integrated circuit device according to a fourth embodiment of the present invention will be explained with reference to FIGS. 6A-6I, wherein those parts corresponding to the parts explained previously are designated by the same reference numerals and the decryption thereof will be omitted.

Figure 6A:
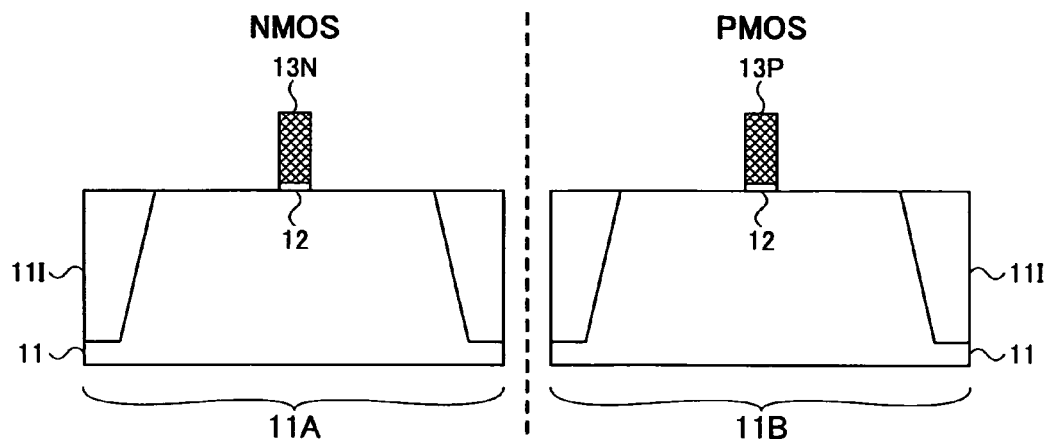
FIGS. 6A-6I are diagrams showing the fabrication process of a semiconductor integrated circuit device according to a fourth embodiment of the present invention.
Figure 6B:
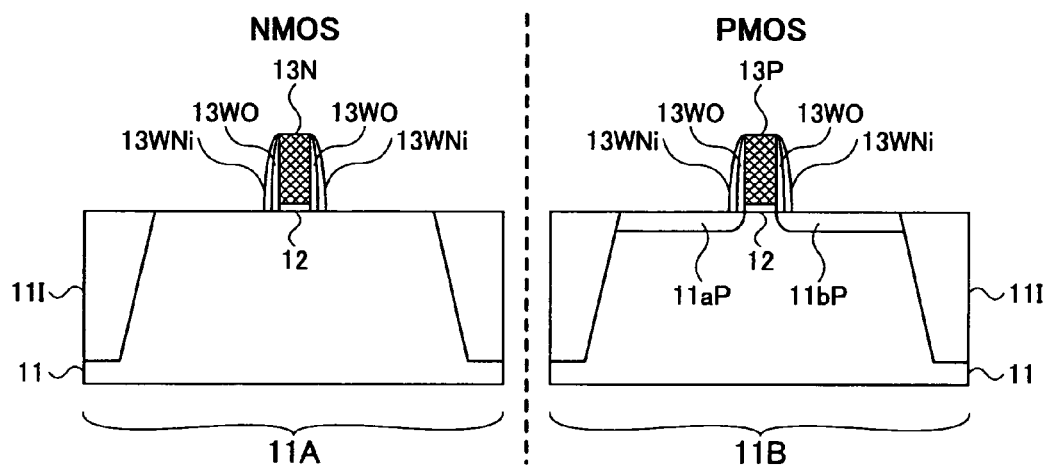

Referring to FIG. 6A, it should be noted that the polysilicon gate electrode 13N is formed in the device region 11A and the polysilicon electrode 13P is formed in the device region 11B, respectively via the gate insulation film, and the inner sidewall oxide films 13WO are formed on the respective sidewall surfaces of the gate electrode 13N and 13P in the step of FIG. 6B with the thickness of about 5 nm by a thermal oxidation process and subsequent etch back process.

It should be noted that the foregoing etch back process is conducted such that the surface of the silicon substrate 11 is exposed, wherein the step of FIG. 6B further includes the steps of forming inner sidewall nitride films 13WNi of SiN with the thickness of typically 5 nm, by depositing an SiN film so as to cover the inner sidewall oxide films WO, and etching back the SiN film thus deposited. It should be noted that this etch back process for forming the inner sidewall nitride films 13WNi is conducted also until the surface of the silicon substrate 11 is exposed.

Further, in the step of FIG. 6B, ion implantation of a p-type impurity element such as B+ is conducted in the device region 11B to form the source and drain extension regions 11$a$P and 11$b$P.

Figure 6C:
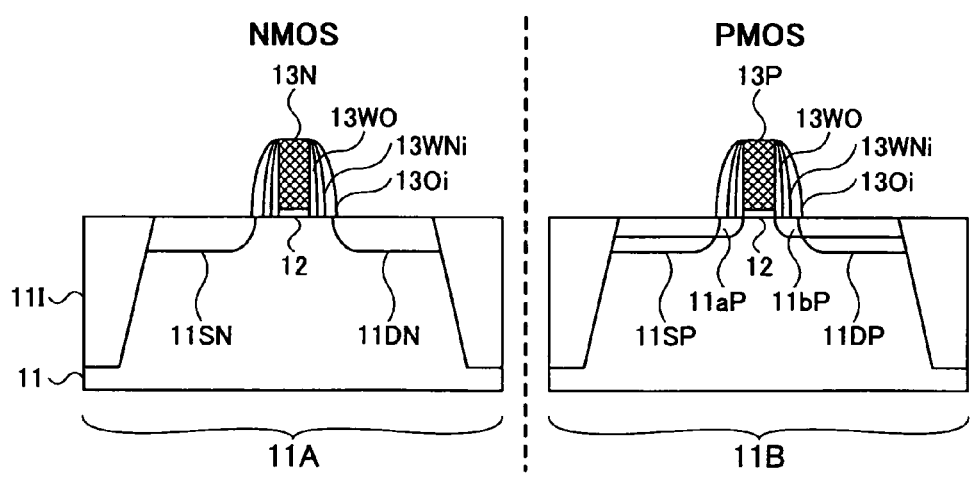

Next, in the step of FIG. 6C, further sidewall oxide films 13Oi are formed on the respective inner sidewall insulation films 13WNi in each of the polysilicon gate electrodes 13N and 13P, and source and drain regions 11SP and 11DP of p-type are formed by introducing a p-type impurity element such as B+ into the device region 11B by an ion implantation process while using the polysilicon gate electrode 13P, the inner sidewall-oxide films 13WO, the inner sidewall insulation films 13WNi and the sidewall oxide film 13O$i$ as a self-aligned mask.

Figure 6D:
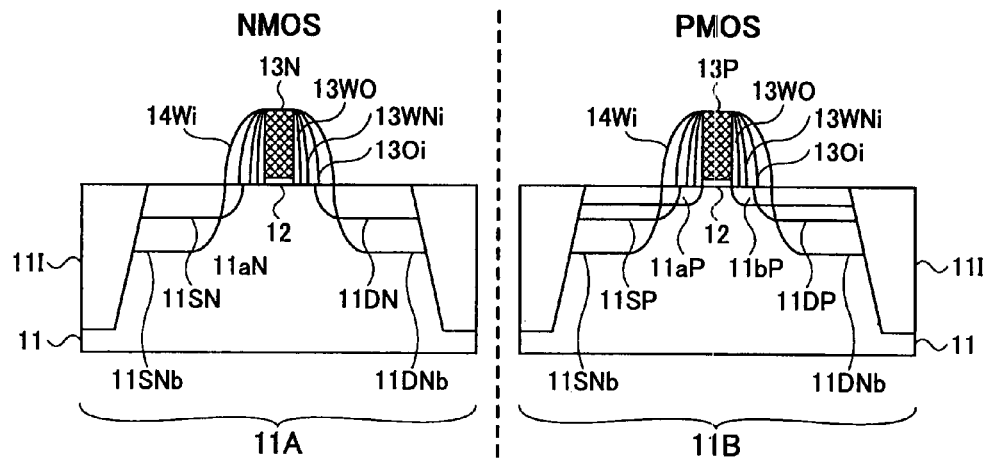

Next, in the step of FIG. 6D, further sidewall oxide films 14Wi are formed on the respective sidewall oxide films 13Oi on each of the polysilicon gate electrodes 13N and 13P in the device regions 11A and 11B, and buffer source and drain regions 11SNb and 11DNb of n-type are formed in the device region 11A by conducting an ion implantation process similar to that of FIG. 2E while using the polysilicon gate electrode 13N, the inner sidewall oxide films 13WO, the inner sidewall insulation films 13WNi, the sidewall oxide films 13Oi and the sidewall oxide films 14Wi as the mask. Further, buffer source and drain regions 11SPb and 11DPb of p-type are formed in the device region 11B by conducting an ion implantation process similar to that of FIG. 2E while using the polysilicon gate electrode 13P, the inner sidewall oxide films 13WO, the inner sidewall insulation films 13WNi, the sidewall oxide films 13Oi and the sidewall oxide films 14Wi as the mask.

Figure 6E:
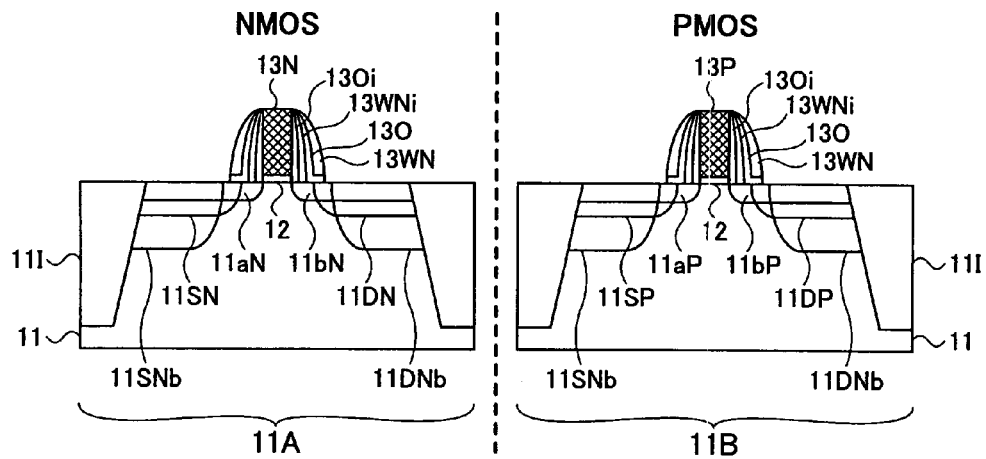

Next, in the step of FIG. 6E, the sidewall oxide films 14Wi and 13Oi are removed by an HF processing and the inner sidewall insulation film 13WNi is exposed. Further, in the device region 11A, an ion implantation process similar to that of FIG. 2A is conducted in the device region 11A while using the polysilicon gate electrode 13N, the inner sidewall oxide films 13WO and the inner sidewall insulation films 13WNi as a mask, and the source and drain extension regions 11$a$N and 11$b$N of n-type are formed.

Further, in the step of FIG. 6E, the sidewall oxide films and sidewall nitride films corresponding to the sidewall oxide film 13O and the sidewall nitride film 13WN are formed on the inner sidewall insulation films 13WNi in each of the polysilicon gate electrodes 13N and 13P.

Figure 6F:
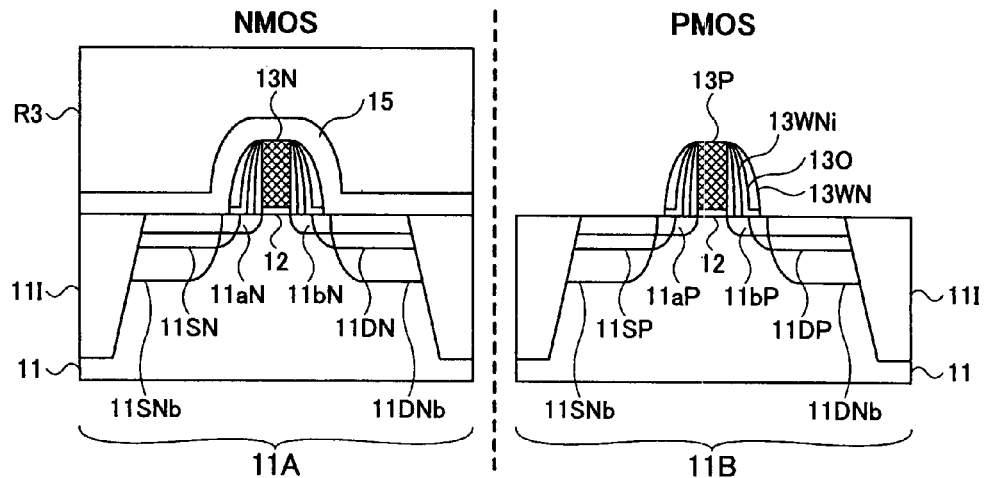

Further, in the step of FIG. 6F, the structure of FIG. 6E is covered with the CVD oxide film 15, and the CVD oxide film 15 is removed from the device region 11B while using the resist pattern R3 as a mask. Further, by conducting the processes respectively corresponding to the steps of FIGS. 5D-5F in the steps of FIGS. 6G-6I, a structure identical with the structure of FIG. 5F except for the structure of the sidewall insulation films of the polysilicon gate electrodes 13N and 13P is obtained in the step of FIG. 6I.

In the previous embodiment, it should be noted that the CVD oxide film 13O covering the sidewall surfaces of the polysilicon gate electrode 13N or 13P covers also the surface of the silicon substrate continuously at both lateral ends of the channel region. With such a construction, there is a possibility that the CVD oxide film 13O undergoes etching by HF on the silicon substrate 11 in the vicinity of the channel region at the time of HF processing such as HF etching process conducted after formation of the trenches 11TA and 11TB in the step of FIG. 2C, FIG. 4E or FIG. 5E. Thus, there has been a need of controlling the etching condition in order to avoid such etching.

With the present embodiment, on the other hand, there are formed inner sidewall insulation films 13WNi at the outer sides of the sidewall oxide films 13WO of the polysilicon gate electrode 13P (and also the polysilicon gate electrode 13N) such that the inner sidewall insulation films 13WNi reach the surface of the silicon substrate 11. Thus, there is no chance for HF to invade into the gate insulation film 12 right underneath the gate electrode 13P or 13N or further into the channel region under the gate insulation film 12, even when the processing including the HF processing is conducted repeatedly. Thereby, fabrication of the semiconductor device is facilitated and improvement is made also with the yield.

Here, it should be noted that the inner sidewall insulation film 13WNi is provided merely for blocking the invasion of HF, and thus, there is no need for the inner sidewall insulation film 13WNi to have a substantial thickness. For example, the thickness of about 5 nm would be sufficient for this purpose.

In the present embodiment, the distance between the SiGe mixed crystal layer 14A or 14B and the channel region is increased slightly. However, decrease of the uniaxial compressive stress induced in the channel region by the SiGe mixed crystal layers 14A and 14B is suppressed minimum by suppressing the thickness of the inner sidewall insulation film 13WNi as small as possible.

Fifth Embodiment

Next, a fifth embodiment of the present invention will be described with reference to FIGS. 7A-7H, wherein those parts corresponding to the parts described previously are designated by the same reference numerals and the description thereof will be omitted.

Figure 7A:
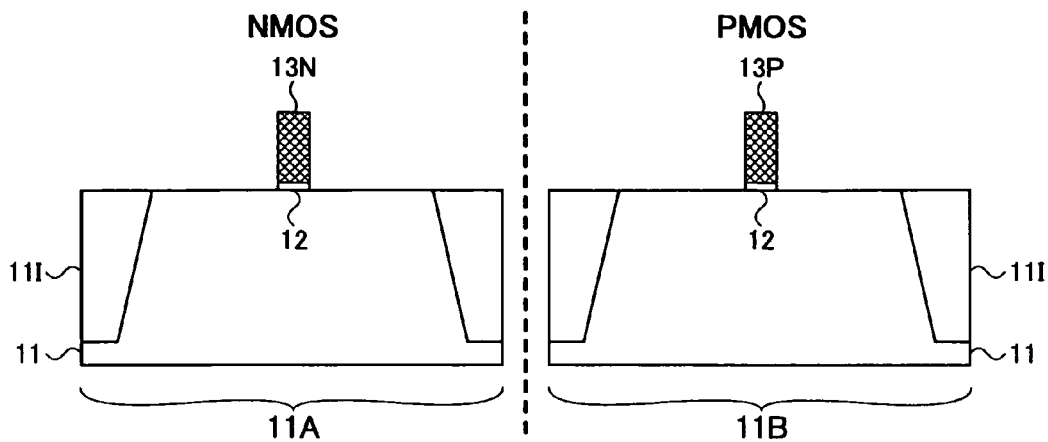

Referring to FIG. 7A, the polysilicon gate electrode 13N of n-type is formed on the silicon substrate 11 in the device region 11A, and the polysilicon gate electrode 13P of p-type is formed on the silicon substrate 11 in the device region 11B, wherein the polysilicon gate electrodes 13N and 13P are formed on the silicon substrate 11 via the gate insulation film 12 of SiON, or the like.

Figure 7B:
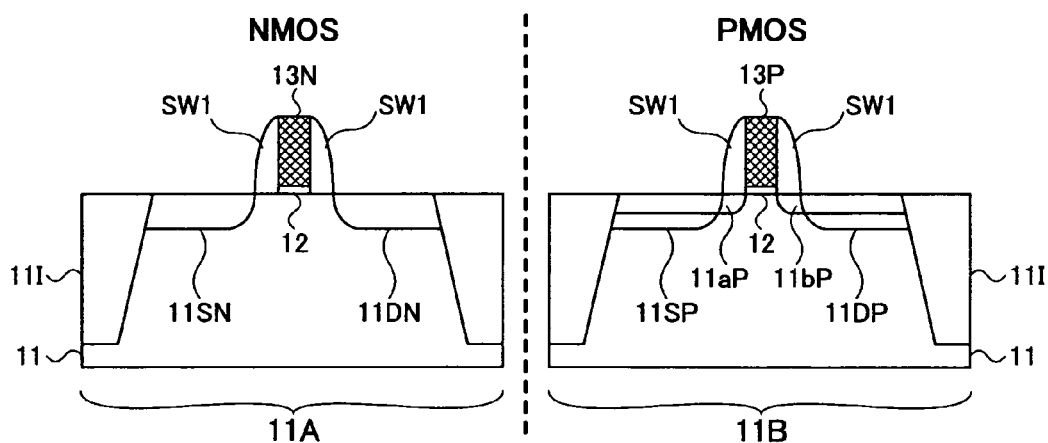

Next, in the step of FIG. 7B, a p-type impurity element is introduced into the device region 11B while using the polysilicon gate electrode 13P as a mask, and there are formed p-type source and drain extension regions 11aP and 11bP in the silicon substrate 11 in correspondence to the device region 11B at both lateral sides of the polysilicon gate electrode 13P.

Further, in the step of FIG. 7B, sidewall oxide films SW1 are formed on each of the polysilicon gate electrodes 13N and 13P, wherein the step of FIG. 7B further includes the step of forming the source and drain diffusion regions 11SN and 11DN of n-type in the silicon substrate 11 by introducing an n-type impurity element into the device region 11A by an ion implantation process while using the polysilicon gate electrode 13N and the sidewall oxide films SW1 thereon as a mask, similarly to the step of FIG. 2B.

Further, in the step of FIG. 7B, a p-type impurity element is introduced into the device region 11B by an ion implantation process similarly to the step of FIG. 2B while using the polysilicon gate electrode 13P and the sidewall oxide films SW1 as a mask. With this, the p-type source and drain regions 11SP and 11DP are formed.

Figure 7C:
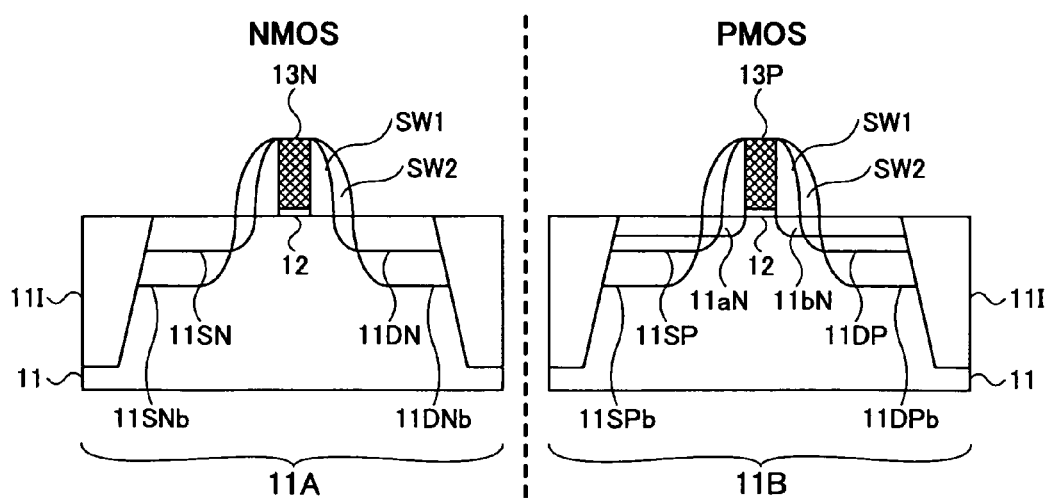

Further, in the step of FIG. 7C, sidewall oxide films SW2 are formed on the respective sidewall oxide films SW1 in each of the polysilicon gate electrodes 13N and 13P, and an n-type impurity element is introduced into the device region 11A by an ion implantation process similarly to the step of FIG. 2C while using the polysilicon gate electrode 13N and the sidewall oxide films SW1 and SW2 as a mask. Withy this, buffer source and drain diffusion regions 11SNb and 11DNb of n⁻-type is formed at a deeper level than the source and drain regions 11SN and 11DN.

Further, in the step of FIG. 7C, a p-type impurity element is introduced into the device region 11B while using the polysilicon gate electrode 13P and the sidewall oxide films SW1 and SW2 as a mask, and the buffer source and drain regions 11SPb and 11DPb of n⁻-type are formed at a deeper level than the source and drain regions 11SP and 11DP.

Figure 7D:
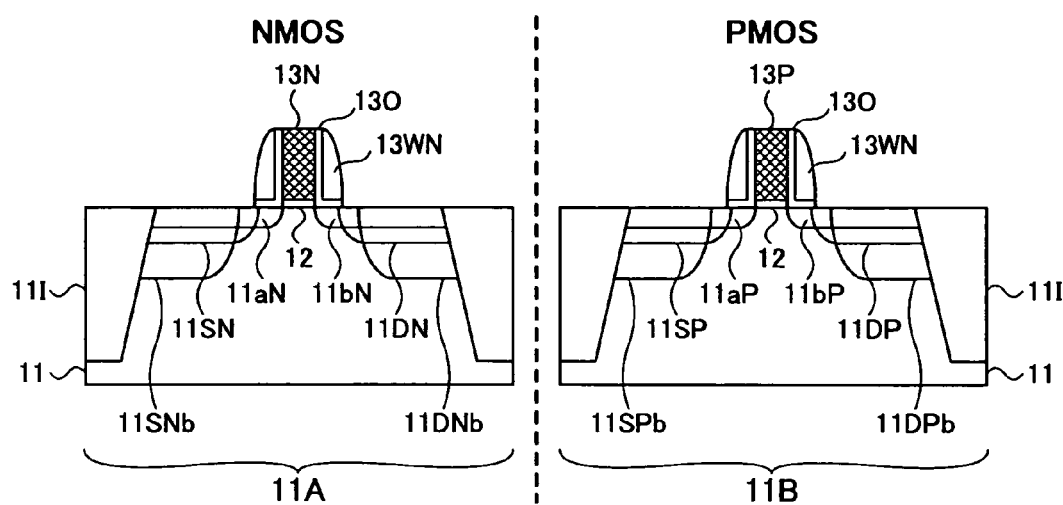

Next, in the step of FIG. 7D, the sidewall oxide films SW1 and SW2 are removed from the sidewall surfaces of the polysilicon gate electrodes 13N and 13P by an HF processing, and an n-type impurity element and a p-type impurity element are introduced respectively into the device region 11A and the device region 11B to form the source and drain extension regions 11aN and 11bN of n-type in the device region 11A at both lateral sides of the gate electrode 13N and the source and drain extension regions 11aP and 11bP of p-type in the device region 11B at both lateral sides of the gate electrode 13P.

Further, in the step of FIG. 7D, formation of the CVD oxide film 13O is conducted, followed by formation of the sidewall insulation films 13WN of SiN by conducting a CVD process of an SiN film and an etch back process of the same conducted such that the surface of the silicon substrate 11 is exposed at the device regions 11A and 11B.

Figure 7E:
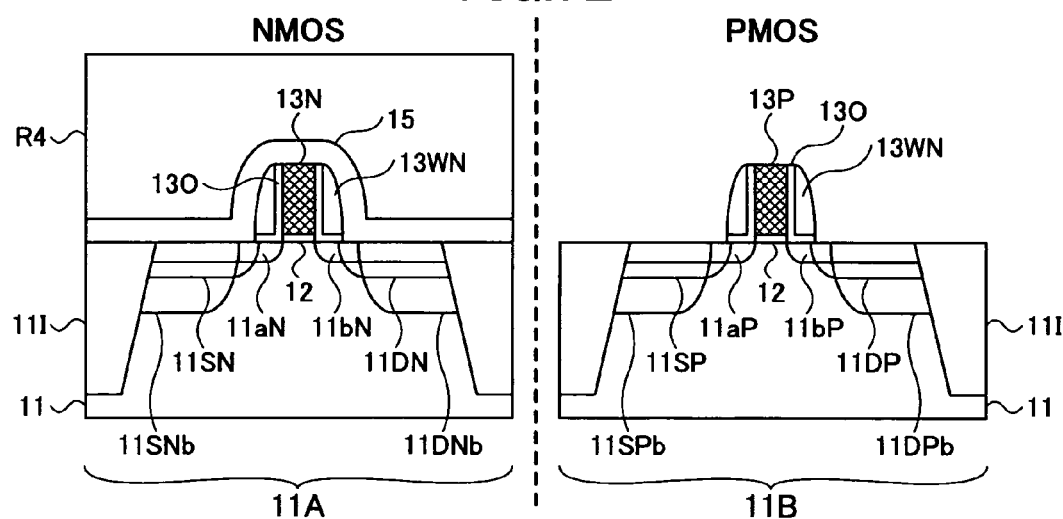

Next, in the step of FIG. 7E, the CVD oxide film 15 is formed on the structure of FIG. 7D, followed by removal of the same from the device region 11B while using a resist pattern R4 formed on the device region 11A as a mask.

Figure 6G:
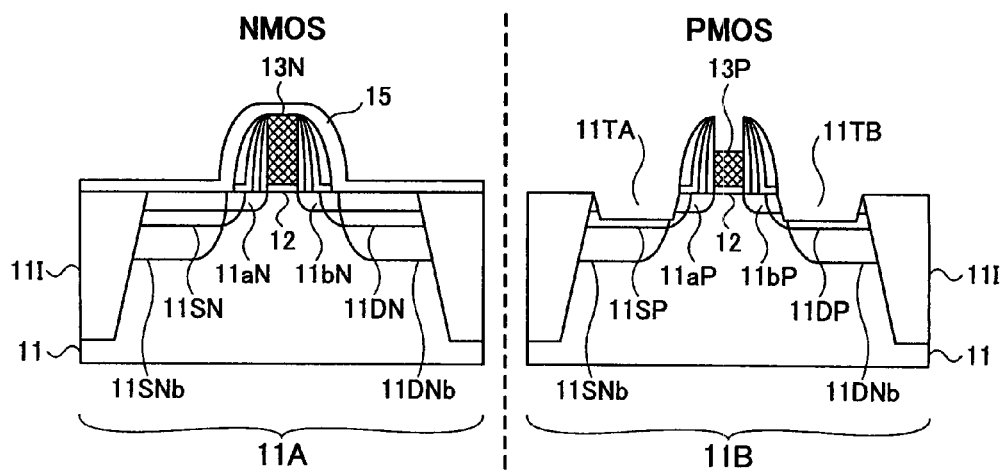
Figure 7F:
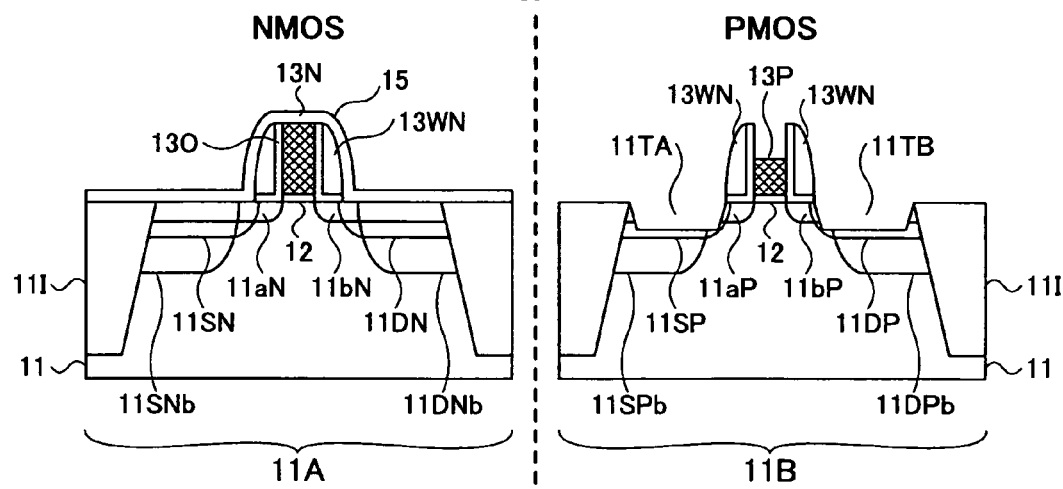

Further, in the step of FIG. 7F, the trenches 11TA and 11TB are formed in the device region 11B while using the CVD oxide film 11B remaining in the device region 15 as a mask and while using the polysilicon gate electrode 13P and the sidewall insulation films 13O and 13WN as a self-aligned mask, similarly to the step of FIG. 6G explained before except for the structure of the gate sidewall insulation films.

Figure 6H:
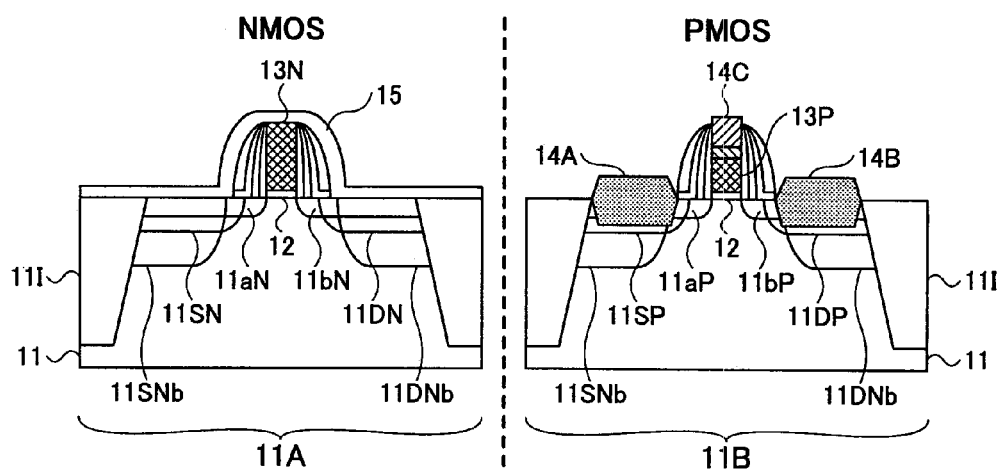
Figure 6I:
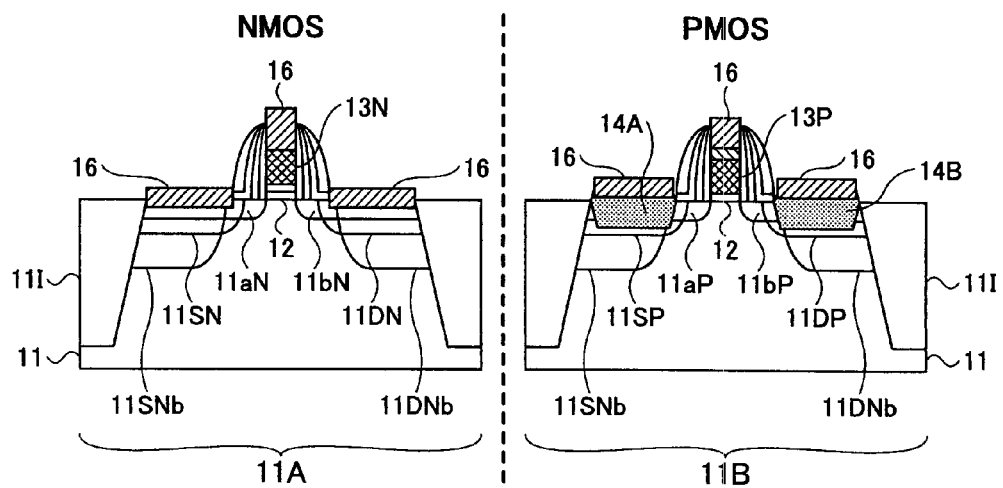

Further, by conducting the steps of FIGS. 7G-7H similarly to the steps of FIGS. 6H-6I, a semiconductor device having a structure similar to the one shown in FIG. 6I except for the structure of the sidewall insulation films, is obtained in the step of FIG. 7H.

Sixth Embodiment

In each of the embodiments explained heretofore, it should be noted that there is formed a CVD oxide film 13O between the polysilicon gate electrode 13N or 13P and the SiN sidewall insulation film 13WN with a thickness of about 10 nm at the time of formation of the SiN sidewall insulation films 13WN on any of the polysilicon gate electrode 13N or 13P, for the purpose of improving the interface characteristics between the polysilicon gate electrode and the SiN sidewall insulation film.

Thereby, it should be noted that the part of the CVD oxide film 13O extending along the sidewall surface of the polysilicon gate electrode 13P is exposed at the top part of the polysilicon gate electrode 13P. Further, the CVD oxide film 13O extends continuously between the SiN sidewall insulation film 13WN and the surface of the silicon substrate 11 and is exposed at the bottom part of the sidewall surface of the SiN sidewall insulation film 13WN.

On the other hand, such a CVD oxide film 13O experiences etching at such exposed parts when an HF processing is conducted at the time of formation of the trenches 11TA and 11TB for cleaning of the trench sidewall surfaces as shown in FIG. 8, and there is formed a deep slit at such exposed part of the CVD oxide film 13O.

It should be noted that such a slit is formed not only at the time of formation of the trenches in the step of FIG. 2C but also removing the outer sidewall insulation films 14Wi by an HF processing. In the example of FIG. 5D, it should be noted that such a slit is formed not only in the p-channel MOS transistor but also in the n-channel MOS transistor.

Particularly, at the time of trench formation in such a silicon substrate 11, it should be noted that the top part of the polysilicon gate 13P itself is removed by etching, and thus, the CVD oxide film 13O is exposed over a wide area. Thereby, such exposed part of the CVD oxide film 13O is subjected to etching at the time of the HF processing.

As a result of such an etching of the CVD oxide film 13O, there are formed deep slits at the sidewall surface and at the bottom surface of the gate electrode as noted above, wherein such slots may become a void accumulating therein impurities or defects in the subsequent processes.

Figure 9:
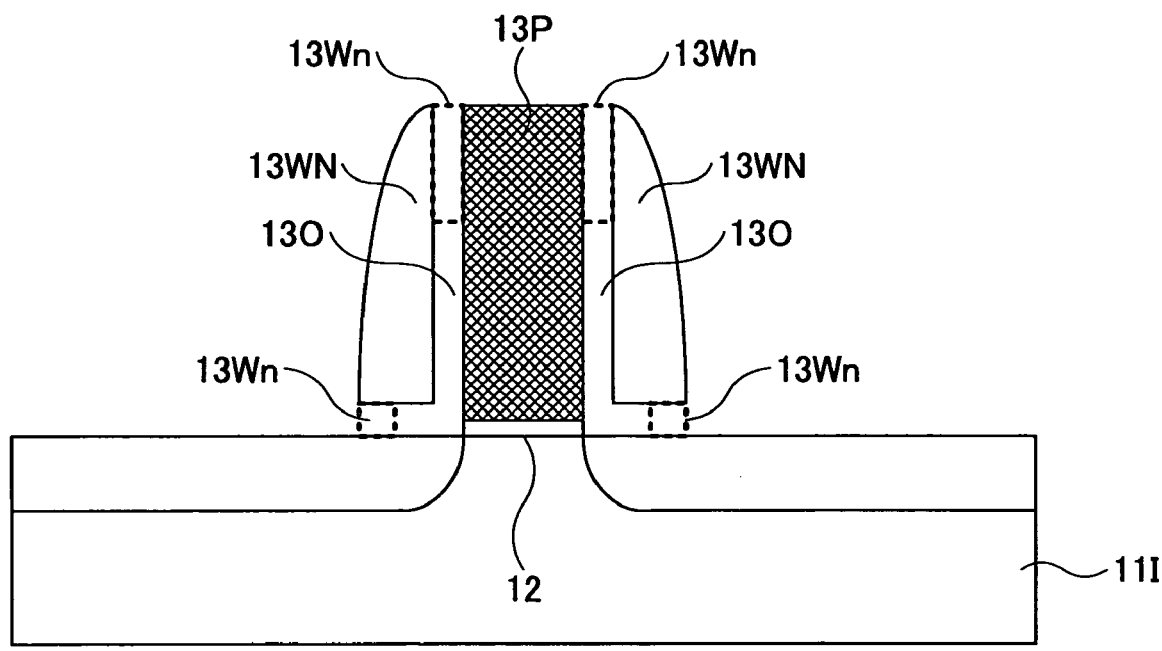
FIG. 9 is a diagram showing the principle of the sixth embodiment of the present invention.

Thus, with the sixth embodiment of the present invention, the exposed part of the CVD oxide film 13O, in which there may be caused etching at the time of the HF processing, is subjected to a controlled HF processing to form a shallow slit and fill such a shallow slit with a layer 13Wn resistant to HF, as shown in FIG. 9, before formation of the trenches.

FIGS. 10A-10D are diagrams showing such a step of filling the part of the CVD oxide film 13O etched by HF with the film 13Wn having resistance against HF, before the HF treatment process. While FIGS. 10A-10D are for the case of a p-channel MOS transistor, the same process is applicable also to an n-channel MOS transistor.

Figure 10A:
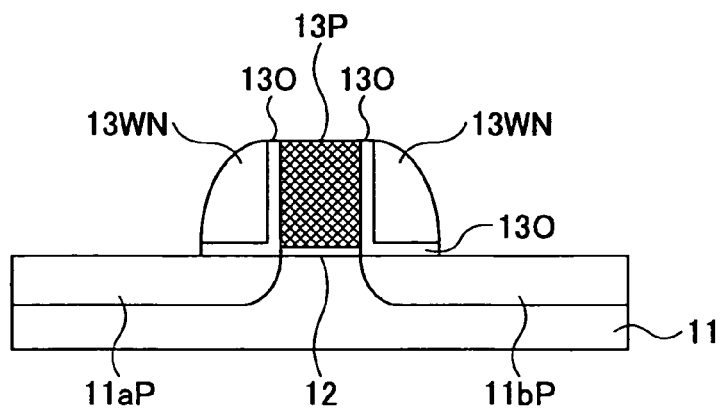
FIGS. 10A-10D are diagrams showing the process of forming the structure of FIG. 9.
Figure 10B:
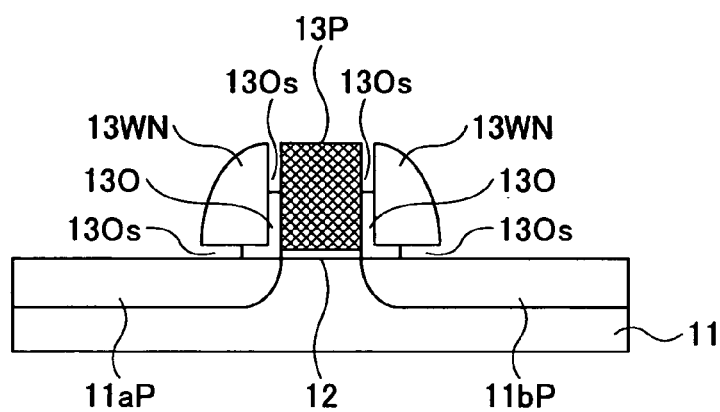

Referring to FIGS. 10A-10D, FIG. 10A corresponds to the state of FIG. 2B, 4B or 5C, in which the SiN sidewall insulation film 13WN is formed further on the sidewall surfaces of the polysilicon gate electrode 13P via the CVD oxide films 13O, wherein the structure of FIG. 10A is processed in HF in the step of FIG. 10B to form slits 13Os in the CVD oxide film 13O before proceeding to the step of FIG. 2C. Thereby, the slits 13Os are formed preferably with a depth of 20-30 nm, in view of the depth of etching occurring in the polysilicon gate electrode 13P during the trench formation step to be conducted later, such that the depth of the slits 13Os becomes at least equal to the foregoing etching depth of the polysilicon gate electrode 13P.

Figure 10C:
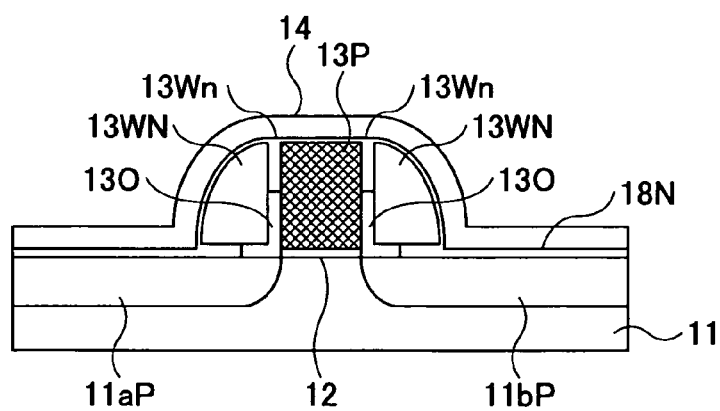

Next, in the step of FIG. 10C, an SiN film 18N is deposited on the structure of FIG. 10B by a CVD process that uses an organic silicon source material and ammonia, such that the SiN film 18N fills the slits 13Os.

For example, it is possible to fill the slits 13Os with the SiN film 18N in correspondence to the film 13Wn of FIG. 9, by forming the SiN film 18N on the silicon substrate 11 with the thickness of 5 nm or less, by supplying bis-tertiary butylaminosilane (BTBAS) for the organic silicon source with a flow rate of 20-400 SCCM, preferably 80-200 SCCM and supplying an ammonia gas with the flow rate of 10-2000 SCCM, particularly 30-500 SCCM, under the pressure of 0.1-1000 Pa, preferably 5-100 Pa at the substrate temperature of 300-700° C., preferably 450-650° C.

Figure 10D:
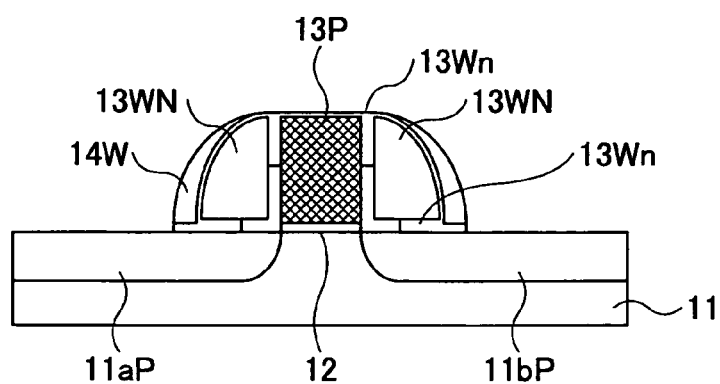

With the step of FIG. 10C, the oxide film 14 is deposited further on the sidewall insulation films 13W, and the sidewall oxide films 14W are formed on the SiN sidewall insulation films 13W in the step of FIG. 10D by etching back the oxide film 14 including the SiN film 18N until the silicon substrate 11 is exposed.

Here, it should be noted that the step of FIG. 10C can be conducted to form an SiON film in place of the SiN film 18N, by conducting the step of FIG. 10C by supplying BTBAS for the organic silicon source with the flow rate of 20-400 SCCM, preferably 80-200 SCCM and an $N_2O$ gas with the flow rate of 10-5000 SCCM, preferably 30-1000 SCCM under the pressure of 0.1-3000 Pa, preferably 5-300 Pa at the substrate temperature of 300-650° C., preferably 450-580° C. By using an SiON film for the HF resistant layer 13Wn, it becomes possible to improve the interface characteristics with regard to the silicon substrate 11 or the polysilicon gate electrode.

In the step of FIG. 10C, it should be noted that the polysilicon gate electrode 13P makes a direct contact with an SiN film at the top part of the gate electrode 13P in the case an SiN film is used for the HF-resistant film 18N. Even in such a case, there arises no problem, as silicide is formed later in such a part.

After the step of FIG. 10D, the process proceeds to the any of the steps of FIG. 2D, FIG. 4E, FIG. 5E and FIG. 6G.

Figure 11A:
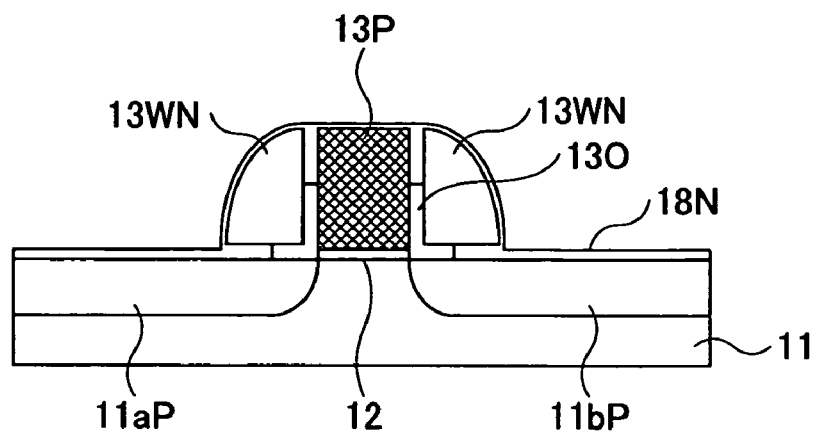
FIGS. 11A and 11B are diagrams showing another example of the process of the sixth embodiment.
Figure 11B:
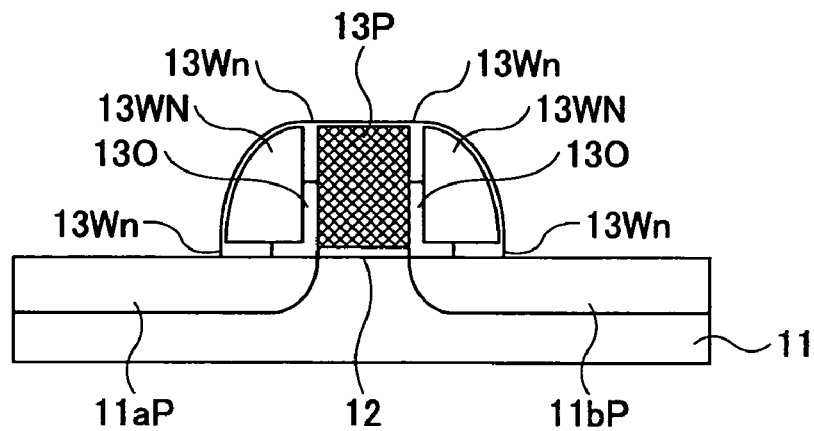

Here, it should be noted that the process of FIGS. 10C and 10D may be modified as shown in FIGS. 11A and 11B in view of the process of FIG. 2C.

In the step of FIG. 11A, it should be noted that the formation of the CVD oxide film 14 is omitted, and as a result, the SiN film 18N deposited with a small thickness on the silicon substrate 11 is removed by the etch back process of FIG. 11B.

Figure 12:
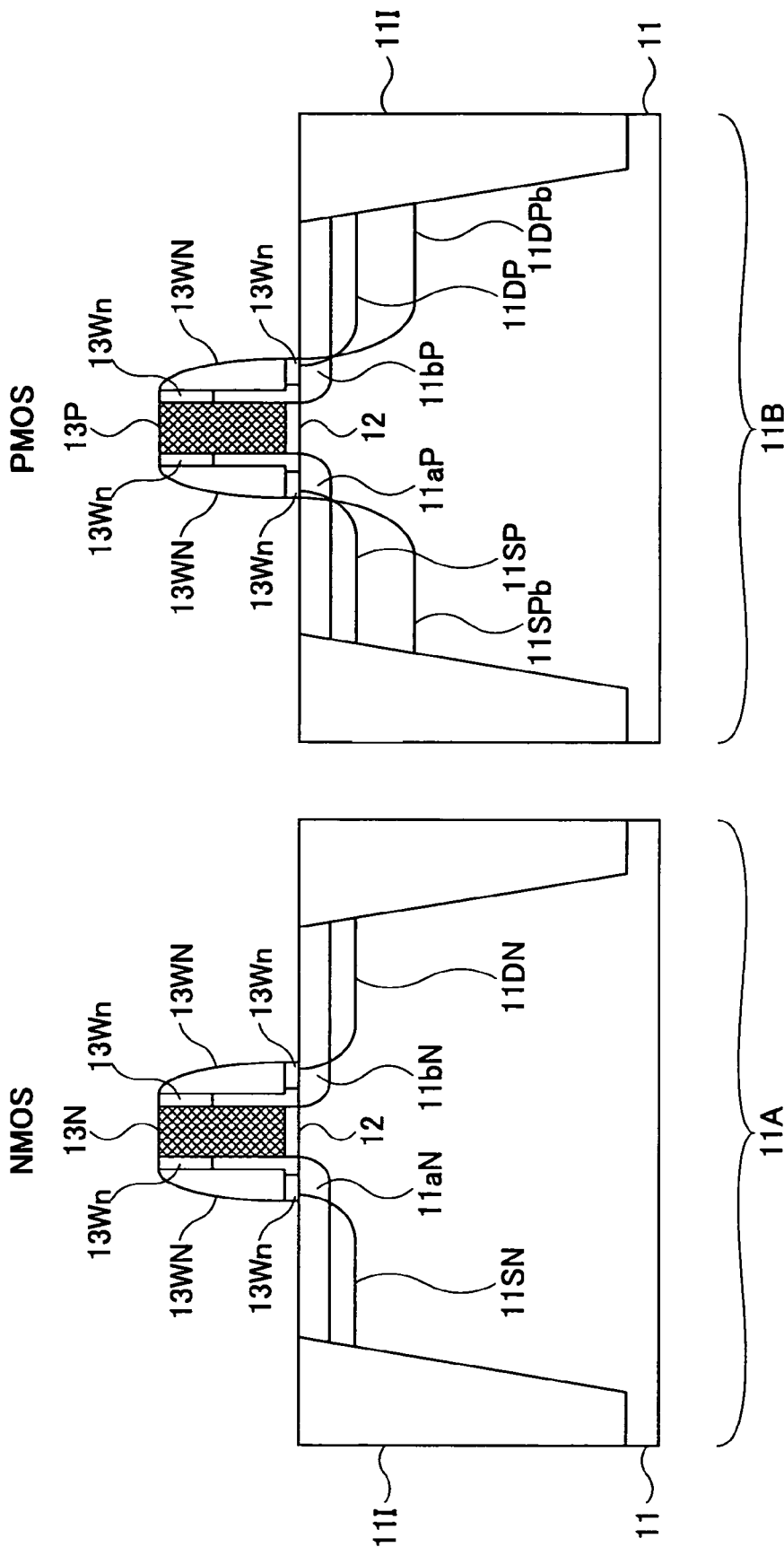
FIG. 12 is a diagram showing an example of the structure obtained with the sixth embodiment for the state before the trench formation step.

It should be noted that such an HF resistance film 13Wn is formed not only in the p-channel MOS transistor but also in the n-channel MOS transistor, and as a result, the structure shown in FIG. 12 is formed on the silicon substrate after the step of FIG. 2B but before starting the step of FIG. 2C.

Further, it is possible with the present invention to carry out the step of FIG. 10C by an atomic CVD process providing excellent step coverage, in which the SiN film or the SiON film is deposited one atomic layer by one atomic layer.

Further, the present invention is not limited to the embodiments described heretofore, but various variations and modifications may be made without departing from the scope of the invention.

What is claimed is:

1. A method of fabricating a semiconductor integrated circuit device, said semiconductor integrated circuit device comprising a silicon substrate defined with a first device region and a second device region by a device isolation structure, an n-channel MOS transistor formed on said first device region and having a first gate electrode pattern, and a p-channel MOS transistor formed on said second device region and having a second gate electrode pattern, said p-channel MOS transistor including p-type SiGe mixed crystal regions formed epitaxially to said silicon substrate at both lateral sides of a channel region right underneath said second gate electrode pattern, said method comprising the steps of:

forming, in each of said first and second device regions, a first sidewall insulation film on respective sidewall surfaces of said first gate electrode pattern and said second gate electrode pattern by using a first material having resistance against HF;

forming a source region and a drain region of p-type in said silicon substrate at both lateral sides of said second gate electrode pattern by conducting an ion implantation process of a p-type impurity element in said second device region while using said second electrode pattern and said fist sidewall insulation film on said second gate electrode pattern as a self-aligned mask;

forming, in said first device region, a second sidewall insulation film having an etching selectivity to said first sidewall insulation film, on said first sidewall insulation film formed on said first gate electrode pattern;

forming a source region and a drain region of n-type in said first device region at both lateral sides of said first gate electrode pattern, by conducting an ion implantation process of an n-type impurity element in said first device region while using said first gate electrode pattern, said first sidewall insulation film and said second sidewall insulation film on said first gate electrode pattern as a self-aligned mask;

forming a mask insulation film so as to cover said first device region and expose said second device region;

forming, after said step of forming said mask insulation film, first and second trenches at both lateral sides of said second gate electrode pattern with separation therefrom by said first sidewall insulation film, by etching said silicon substrate in said second device region while using said second gate electrode pattern and said first sidewall insulation film on said second gate electrode pattern as a mask; and forming, after said step of forming said first and second trenches, said p-type SiGe mixed crystal regions by causing an epitaxial growth of a p-type SiGe mixed crystal layer in said first and second trenches in a state in which said first device region is covered with said mask insulation film.

2. The method as claimed in claim 1, wherein said step of etching said silicon substrate comprises any of the step of processing a surface of said first and second trenches with HF or an organic alkaline etchant and the step of processing said surface of said first and second trenches by a combination of an isotropic dry etching process or a wet etching process that uses HF or said organic alkaline etchant and a dry etching process.

3. The method as claimed in claim 1, further comprising the steps of:
forming source and drain extension regions of n-type in said silicon substrate at both lateral sides of said first gate electrode in correspondence to an edge of said first gate electrode, by introducing, before said step of formation of said first sidewall insulation film, an n-type impurity element into said first device region while using said first gate electrode as a mask; and
forming source and drain extension regions of p-type in said silicon substrate at both lateral sides of said second gate electrode in correspondence to an edge of said second gate electrode, by introducing, before said step of forming said first sidewall insulation film, a p-type impurity element into said second device region while using said second gate electrode as a mask,
said formation step of said source and drain regions of n-type and said formation step of said source and drain regions of p-type are conducted concurrently.

4. The method as claimed in claim 1, wherein said step of forming said first and second sidewall insulation films comprises the steps of:
forming, before formation of said first and second sidewall insulation films, an oxide film on a surface of said first and second gate electrodes such that said oxide film covers continuously said respective sidewall surfaces of said first and second gate electrodes and further respective surface parts of said silicon substrate on which said first and second gate electrodes are formed;
wet etching, after said step of forming said first and second sidewall insulation films, said oxide film in HF to form first and second slits in said first and second gate electrodes respectively, such that said first slit extends between said sidewall surface of said first gate electrode and said first sidewall insulation film and between said first sidewall insulation film and a part of said silicon substrate underneath said first sidewall insulation film, and such that said second slit extends between said sidewall surface of said second gate electrode and second first sidewall insulation film and between said second sidewall insulation film and a part of said silicon substrate underneath said second sidewall insulation film; and
filling said first and second slits with an insulation film resistant against HF.

5. The method as claimed in claim 1, wherein said second sidewall insulation film on said first gate electrode pattern is formed, after formation of said p-type SiGe mixed crystal regions, by etching back an insulation film having an etching selectivity to said first sidewall insulation film and provided on said first sidewall insulation film.

6. The method as claimed in claim 5, wherein said step of forming said source and drain regions of n-type in said first device region comprises the step of introducing said n-type impurity element by an ion implantation process under a first acceleration voltage with a first dose, said step of forming said source and drain regions of n-type further comprises the step, conducted concurrently to said step of forming said source and drain regions of p-type in said second device region, of introducing said second impurity element into said first device region by an ion implantation process with a second acceleration voltage larger than said first acceleration voltage with a second dose smaller than said first dose while using said first gate electrode pattern and said first sidewall insulation film on said first gate electrode pattern as a self-aligned mask.

7. The method as claimed in claim 1, wherein said step of forming said second sidewall insulation film on said first sidewall insulation film on said first gate electrode pattern in said first device region further comprises the step of forming said second sidewall insulation film also on said first sidewall insulation film on said second gate electrode pattern, said step of forming said source and drain regions of p-type in said second device region is conducted after said step of forming said source and drain regions of n-type in said first device region in the state in which said second sidewall insulation film on said second gate electrode pattern is removed.

8. The method as claimed in claim 7, wherein said step of forming said second insulation film in said first device region on said first sidewall insulation film on said first gate electrode pattern further comprises the step of concurrently forming said second sidewall insulation film on said first sidewall insulation film on said second gate electrode pattern in said second device region,
said step of forming said source and drain regions of p-type in said second device region is conducted prior to said step of forming said second sidewall insulation film on said second gate electrode pattern.

9. The method as claimed in claim 8, wherein said step of forming said source and drain regions of p-type in said second device region comprises the steps of introducing said p-type impurity element by an ion implantation process under a first acceleration voltage with a first dose and introducing said p-type impurity element by an ion implantation process under a second, larger acceleration voltage with a second, smaller dose.

* * * * *